(12) United States Patent
Eichler et al.

(10) Patent No.: US 10,637,211 B2
(45) Date of Patent: Apr. 28, 2020

(54) LIGHT-EMITTING SEMICONDUCTOR CHIP AND METHOD FOR PRODUCING A SEMICONDUCTOR LIGHT-EMITTING CHIP

(71) Applicant: OSRAM Opto Semiconductors GmbH, Regensburg (DE)

(72) Inventors: Christoph Eichler, Donaustauf (DE); Andre Somers, Obertraubling (DE); Bernhard Stojetz, Wiesent (DE); Andreas Loeffler, Neutraubling (DE); Alfred Lell, Maxhuette-Haidhof (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/594,397

(22) Filed: May 12, 2017

(65) Prior Publication Data
US 2017/0331257 A1    Nov. 16, 2017

(30) Foreign Application Priority Data
May 13, 2016  (DE) .................. 10 2016 108 892

(51) Int. Cl.
*H01L 33/00*  (2010.01)
*H01L 33/32*  (2010.01)
(Continued)

(52) U.S. Cl.
CPC ........ *H01S 5/4087* (2013.01); *H01L 21/0254* (2013.01); *H01L 21/02458* (2013.01); *H01L 21/02617* (2013.01); *H01L 27/153* (2013.01); *H01L 33/0025* (2013.01); *H01L 33/0075* (2013.01); *H01S 5/1053* (2013.01); *H01S 5/1096* (2013.01); *H01S 5/3013* (2013.01); *H01L 33/0095* (2013.01); *H01L 33/32* (2013.01); *H01L 33/325* (2013.01); *H01S 5/026* (2013.01); *H01S 5/22* (2013.01); *H01S 5/32341* (2013.01); *H01S 2304/00* (2013.01)

(58) Field of Classification Search
USPC ......... 438/37, 87, 936, FOR. 288, FOR. 480
See application file for complete search history.

(56) References Cited

U.S. PATENT DOCUMENTS

| 4,654,090 A | 3/1987 | Burnham et al. |
| 4,855,255 A | 8/1989 | Goodhue |

(Continued)

FOREIGN PATENT DOCUMENTS

| CN | 1341275 A | 3/2002 |
| CN | 101044601 A | 9/2007 |

(Continued)

OTHER PUBLICATIONS

English translation of JP201092952, total pp. 14.*

(Continued)

*Primary Examiner* — Bo B Jang
(74) *Attorney, Agent, or Firm* — McDermott Will & Emery LLP

(57) ABSTRACT

A light-emitting semiconductor chip (100) is provided, having a first semiconductor layer (1), which is at least part of an active layer provided for generating light and which has a lateral variation of a material composition along at least one direction of extent. Additionally provided is a method for producing a semiconductor chip (100).

8 Claims, 15 Drawing Sheets

Figure 1:
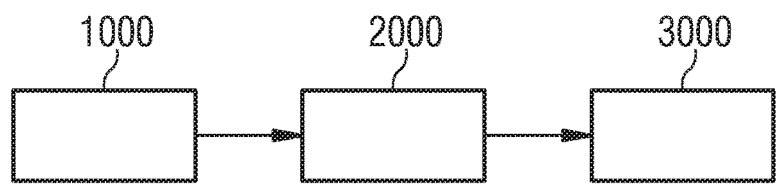

(51) Int. Cl.
  *H01S 5/40* (2006.01)
  *H01S 5/10* (2006.01)
  *H01S 5/30* (2006.01)
  *H01L 27/15* (2006.01)
  *H01L 21/02* (2006.01)
  *H01S 5/323* (2006.01)
  *H01S 5/026* (2006.01)
  *H01S 5/22* (2006.01)

(56) References Cited

U.S. PATENT DOCUMENTS

| | | | |
|---|---|---|---|
| 5,093,696 | A | 3/1992 | Kinoshita |
| 5,436,192 | A | 7/1995 | Epler et al. |
| 5,573,976 | A | 11/1996 | Kato et al. |
| 7,470,602 | B2 | 12/2008 | Kudo et al. |
| 9,728,673 | B2 | 8/2017 | Nataf et al. |
| 2002/0013114 | A1 | 1/2002 | Ohtani et al. |
| 2003/0148565 | A1 | 8/2003 | Yamanaka |
| 2005/0008351 | A1 | 1/2005 | Gat et al. |
| 2006/0228897 | A1 | 10/2006 | Timans |
| 2010/0034234 | A1 | 2/2010 | Hata et al. |
| 2010/0276710 | A1 | 11/2010 | Sampath et al. |
| 2012/0207180 | A1 | 8/2012 | Nam |
| 2014/0064314 | A1 | 3/2014 | Shur et al. |
| 2015/0323143 | A1 | 11/2015 | Raring et al. |
| 2016/0005918 | A1 | 1/2016 | Nataf et al. |
| 2017/0330996 | A1 | 11/2017 | Lell et al. |

FOREIGN PATENT DOCUMENTS

| | | |
|---|---|---|
| CN | 101145518 A | 3/2008 |
| CN | 102473607 A | 5/2012 |
| CN | 105051917 A | 11/2015 |
| EP | 0749154 A2 | 12/1996 |
| EP | 2 119 683 A1 | 11/2009 |
| JP | S5992522 A | 5/1984 |
| JP | S62145888 A | 9/1987 |
| JP | S63114287 A | 5/1988 |
| JP | S63-188940 A | 8/1988 |
| JP | S63227089 A | 9/1988 |
| JP | S63311787 A | 12/1988 |
| JP | H03119760 A | 5/1991 |
| JP | H03297187 A | 12/1991 |
| JP | H04211117 A | 8/1992 |
| JP | H05-190977 A | 7/1993 |
| JP | H05343801 A | 12/1993 |
| JP | H06124901 A | 5/1994 |
| JP | H07221027 A | 8/1995 |
| JP | H08148757 A | 6/1996 |
| JP | H09008402 A | 1/1997 |
| JP | H09283858 A | 10/1997 |
| JP | H11-097371 A | 4/1999 |
| JP | H11330548 A | 11/1999 |
| JP | 200031595 A | 1/2000 |
| JP | 2000100728 A | 4/2000 |
| JP | 2001085742 A | 3/2001 |
| JP | 2001261500 A | 9/2001 |
| JP | 2003-008143 A | 1/2003 |
| JP | 200386890 A | 3/2003 |
| JP | 2003303993 A | 10/2003 |
| JP | 2004-079867 A | 3/2004 |
| JP | 2004288723 A | 10/2004 |
| JP | 2008189492 A | 8/2008 |
| JP | 2009166115 A | 7/2009 |
| JP | 201092952 A | 4/2010 |
| JP | 2011077341 A | 4/2011 |
| JP | 2011210885 A | 10/2011 |
| JP | 201259963 A | 3/2012 |
| JP | 2013254894 A | 12/2013 |
| JP | 2016508668 A | 3/2016 |
| JP | 2017208544 A | 11/2017 |
| JP | 6463405 B2 | 1/2019 |
| KR | 10-2011-0011775 A | 8/2017 |
| WO | 2013023197 A2 | 2/2013 |

OTHER PUBLICATIONS

Final Notification of Reasons for Refusal dated Jan. 28, 2019 for JP Pat. App. No. 2017-095643.
Notice of Reasons for Refusal dated Sep. 10, 2018 in Japanese Patent Application No. 2017-095646.
First Office Action dated Dec. 26, 2018, issued against corresponding Chinese Patent Application No. 201710339986.9, including English translation (16 pages).
First Office Action dated Dec. 28, 2018, issued against corresponding Chinese Patent Application No. 201710339165.5, including English translation (15 pages).
First Office Action dated Dec. 26, 2018, issued against corresponding Chinese Patent Application No. 201710339975.0, including English translation (16 pages).
Decision of Refusal dated Jun. 3, 2019 in Japanese Patent Application No. 2017-095646.
Second Office Action dated Aug. 2, 2019 in Chinese Patent Application No. 201710339986.9.
Second Office Action dated Aug. 20, 2019 in Chinese Patent Application No. 201710339975.0.
Second Office Action dated Aug. 22, 2019 in Chinese Patent Application No. 201710339165.5.
Decision of Refusal dated Sep. 10, 2019 in Japanese Patent Application No. 2017-095643.
Decision to Grant dated Oct. 23, 2019 in Japanese Patent Application No. 2017-95646.
Notification of Reasons of Refusal dated Nov. 25, 2019 in Japanese Patent Application No. 2018-245135.
Decision on Rejection dated Jan. 15, 2020 in Chinese Patent Application No. 201710339986.9.
Japanese Decision to Grant, Japanese Application No. 2017-95643, dated Feb. 25, 2020, pp. 1-7 (including machine generated English translation).

* cited by examiner

FIG 5J
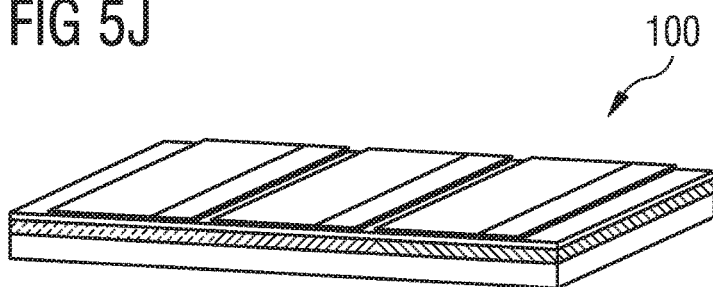
FIG 5K
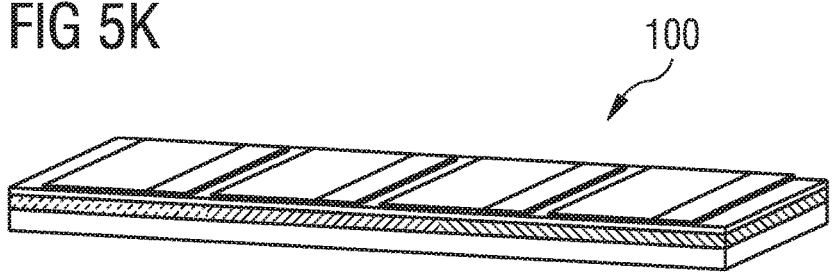
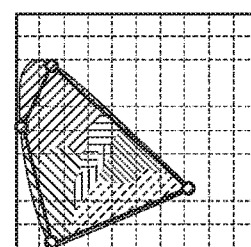
FIG 5L
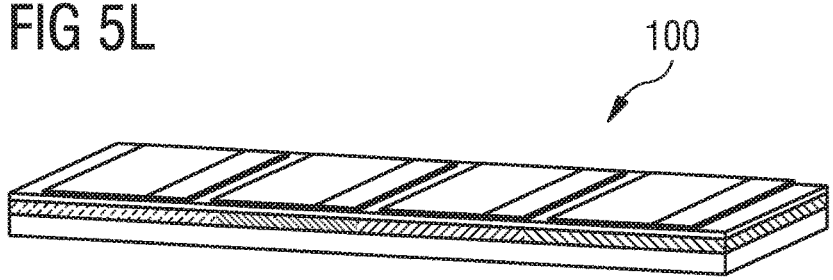
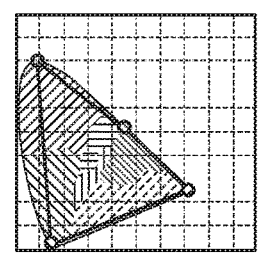
FIG 5M
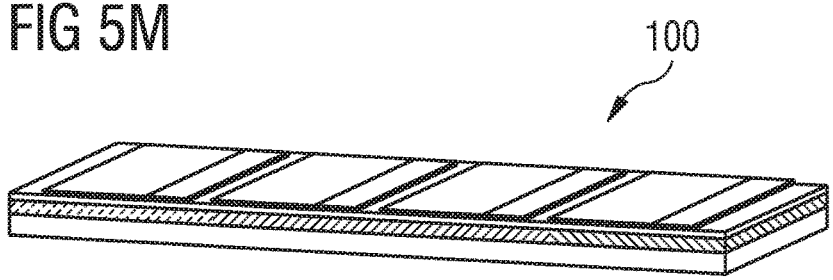
FIG 5N
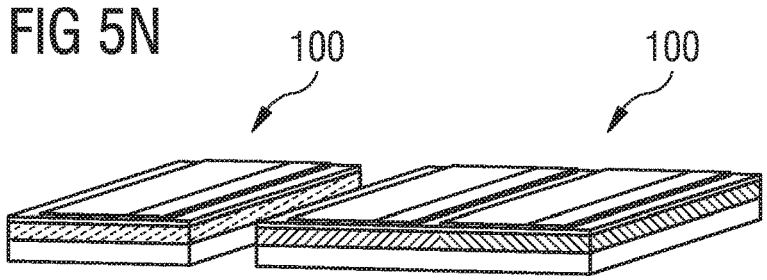

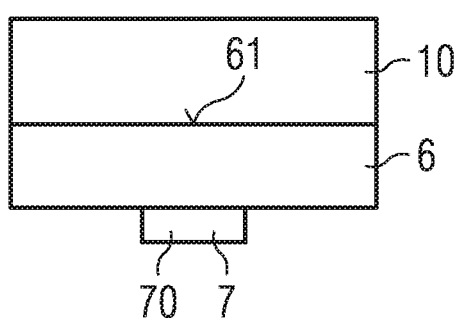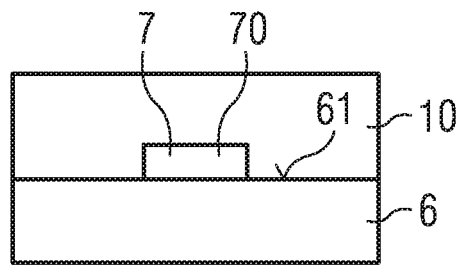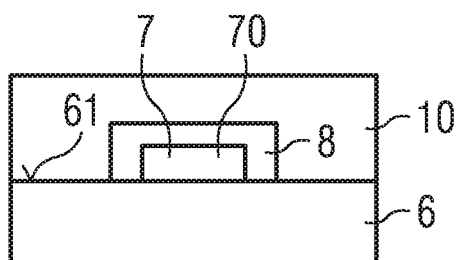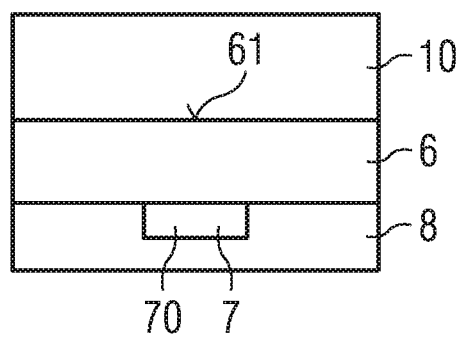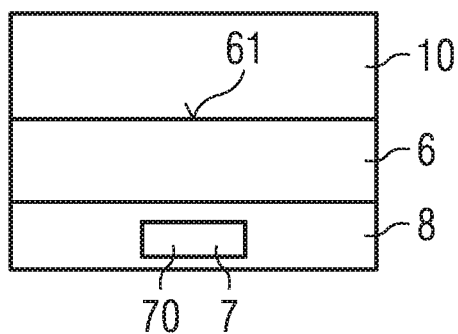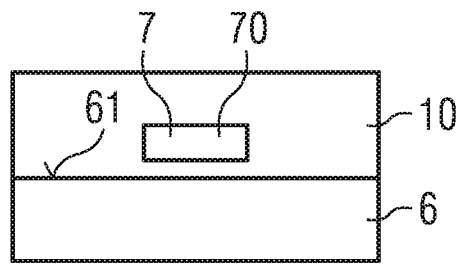

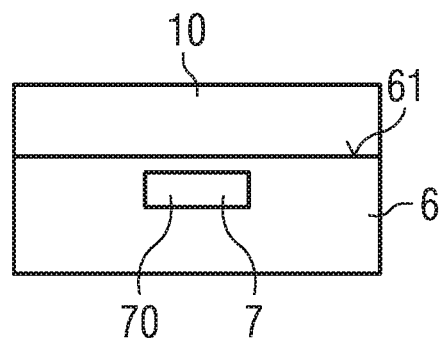
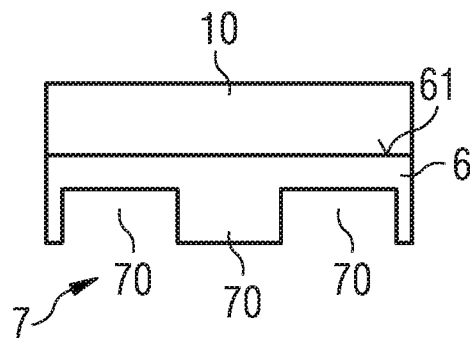
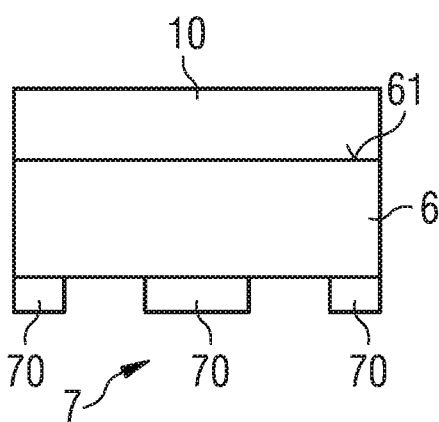
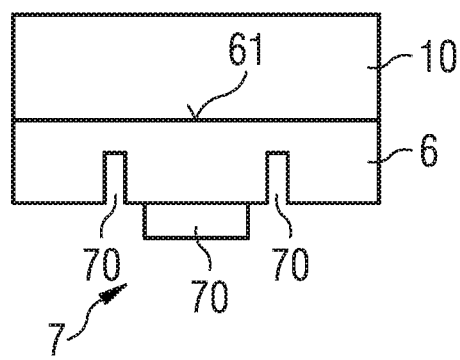
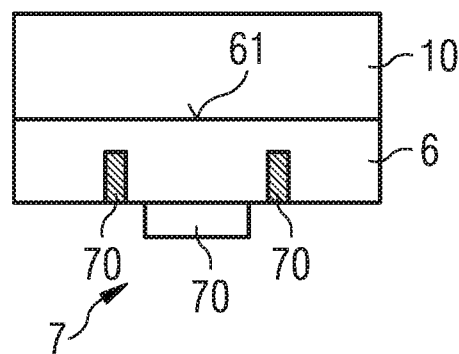

LIGHT-EMITTING SEMICONDUCTOR CHIP AND METHOD FOR PRODUCING A SEMICONDUCTOR LIGHT-EMITTING CHIP

This patent application claims the priority of the German patent application 10 2016 108 892.7, the disclosure content of which is hereby included by back reference.

A light-emitting semiconductor chip, and a method for producing a light-emitting semiconductor chip, are provided.

For a large number of laser-based applications such as projection applications, for example, suitable laser diodes that emit in several wavelengths and in which the wavelength varies definitively are lacking. Furthermore, it would be greatly advantageous for laser projection if a laser source could produce slightly varying wavelengths, in order thereby to reduce the occurrence of speckle patterns. Laser sources with different wavelengths are also required for message transmission with wavelength multiplexing and in bio-sensor technology.

For the aforesaid applications various laser diodes with correspondingly different emission wavelengths are normally selected, which leads, however, to a high logistical outlay and a reduced yield on account of the rejection of laser diodes with unsuitable wavelengths. The selected laser diodes with different wavelengths must furthermore be soldered on individually. Appropriate heat sinks, bond wires and housings must also be provided respectively for the individual laser diodes. As a consequence of unavoidable assembly tolerances, it is also necessary to adjust the required optics for each diode individually. This gives rise to high assembly costs and impaired yields. Added to this is the fact that the minimum possible size is sharply restricted, which makes usage difficult or even impossible in applications in which compactness is crucially important.

At least one object of particular embodiments is to provide a light-emitting semiconductor chip. At least one object of further embodiments is to provide a method for producing a light-emitting semiconductor chip.

These objects are achieved by an item and a method according to the independent claims. Advantageous embodiments and developments of the item and the method are characterized in the dependent claims, and are also disclosed by the following description and the drawings.

According to at least one embodiment, a semiconductor chip has at least one first semiconductor layer. The first semiconductor layer may be, in particular, part of a semiconductor layer sequence that has a plurality of semiconductor layers.

The semiconductor chip can be realized in particular as a light-emitting semiconductor chip, for instance as a light-emitting diode chip or laser diode chip.

According to at least one further embodiment, in the case of a method for producing a semiconductor chip, at least one first semiconductor layer is grown-on. The first semiconductor layer may be, in particular, part of a semiconductor layer sequence.

The embodiments described above and in the following relate equally to the method for producing the semiconductor chip and to the semiconductor chip.

The semiconductor layer sequence may be realized, in particular, as an epitaxial layer sequence, i.e. as an epitaxially grown semiconductor layer sequence. The semiconductor layer sequence in this case may be realized, for example, on the basis of InAlGaN. InAlGaN-based semiconductor layer sequences include, in particular, those in which the epitaxially produced semiconductor layer sequence normally has a layer sequence of differing individual layers, which includes at least one individual layer having a material from the III-V compound semiconductor material system $In_xAl_yGa_{1-x-y}N$, with $0 \leq x \leq 1$, $0 \leq y \leq 1$ and $x+y \leq 1$. In particular, the first semiconductor layer may be based on such a material. Semiconductor layer sequences that have at least one InAlGaN-based active layer as part of a light-emitting semiconductor chip may preferably, for example, emit electromagnetic radiation in an ultraviolet to green wavelength range.

Alternatively or additionally, the semiconductor layer sequence may also be based on InAlGaP, meaning that the semiconductor layer sequence may have differing individual layers, of which at least one individual layer, for example, the first semiconductor layer, may have a material from the III-V compound semiconductor material system $In_xAl_yGa_{1-x-y}P$, with $0 \leq x \leq 1$, $0 \leq y \leq 1$ and $x+y \leq 1$. Semiconductor layer sequences that have at least one InAlGaP-based active layer as part of a light-emitting semiconductor chip may preferably, for example, emit electromagnetic radiation having one or more spectral components in a green to red wavelength range.

Alternatively or additionally, the semiconductor layer sequence may also have other III-V compound semiconductor material systems, for example an InAlGaAs-based material, or II-VI compound semiconductor material systems. In particular, an active layer of a light-emitting semiconductor chip that has an InAlGaAs-based material may be suitable for emitting electromagnetic radiation having one or more spectral components in a red to infrared wavelength range.

A II-VI compound semiconductor material system may have at least one element from the second main group, such as, for example, Be, Mg, Ca, Sr, and one element from the sixth main group, such as, for example, O, S, Se. In particular, a II-VI compound semiconductor material comprises a binary, ternary or quaternary compound that comprises at least one element from the second main group and at least one element from the sixth main group. Such a binary, ternary or quaternary compound may additionally have, for example, one or more dopants and additional constituents. For example, the II/VI compound semiconductor materials include: ZnO, ZnMgO, CdS, ZnCdS, MgBeO.

The first semiconductor layer and, in particular, the semiconductor layer sequence having the first semiconductor layer may be grown on a substrate that, here and in the following, may also be referred to as a growth substrate. The substrate in this case may comprise a semiconductor material, for example a compound semiconductor material system mentioned above, or another material, that allows epitaxial deposition. In particular, the substrate may comprise sapphire, GaAs, GaP, GaN, InP, SiC, Si and/or Ge, or be of such a material.

The semiconductor layer sequence of a semiconductor chip embodied as a light-emitting semiconductor chip may have, as an active layer, for example, a conventional pn junction, a double heterostructure, a single-quantum well structure (SQW structure) or a multi-quantum well structure (MQW structure) for the purpose of light generation or light detection. The semiconductor layer sequence may comprise, in addition to the active layer, further functional layers and functional regions, for instance p- or n-doped charge-carrier transport layers, i.e. electron or hole transport layers, non-doped or p- or n-doped confinement, cladding or waveguide layers, barrier layers, planarizing layers, buffer layers, protective layers and/or electrodes, and combinations thereof. In particular, the first semiconductor layer may be at least part of an active layer, or be such a layer. Moreover, the first semiconductor layer may also be part of another functional layer of the semiconductor layer sequence, for example, a waveguide layer, or be such a layer. For example, the first semiconductor layer may be composed of one layer. Moreover, it is also possible for the first semiconductor layer to have a plurality of layers, or to be composed of a plurality of layers.

Furthermore, additional layers, for instance buffer layers, barrier layers and/or protective layers, may also be arranged perpendicularly in relation to the direction of growth of the semiconductor layer sequence, for example around the semiconductor layer sequence, i.e., for instance, on the side faces of the semiconductor layer sequence.

The first semiconductor layer and, in particular, a semiconductor layer sequence having the first semiconductor layer may be grown on a growth substrate by means of an epitaxial method, for example by means of metalorganic vapor phase epitaxy (MOVPE) or molecular beam epitaxy (MBE), and additionally provided with electrical contacts. The production of the first semiconductor layer and, in particular, of a semiconductor layer sequence having the first semiconductor layer, described in detail in the following, in this case may particularly preferably be effected in a wafer composite that, following the growth process, can be singulated by being divided into a plurality of semiconductor chips.

According to a further embodiment, during the growth process for growing the first semiconductor layer, an inhomogeneous lateral temperature distribution is created along at least one direction of extent of the growing first semiconductor layer. Here and in the following "lateral" denotes a direction that is oriented perpendicularly, or substantially perpendicularly, in relation to a direction of growth of the first semiconductor layer and, in particular, of the semiconductor layer sequence having the first semiconductor layer. The direction of growth in this case corresponds to the direction of arrangement of the individual layers of the semiconductor layer sequence that are arranged on one another. In particular, the first semiconductor layer, and furthermore also the other layers of the semiconductor layer sequence, may have an extent in the lateral direction that is greater than a thickness of the corresponding layers in the direction of growth. Accordingly, the first semiconductor layer, and furthermore also the other layers of the semiconductor layer sequence, may extend along directions of extent in differing lateral directions over the growth substrate.

In the case of the method described here, the inhomogeneous lateral temperature distribution along at least one direction of extent of the growing first semiconductor layer causes and produces a lateral variation of a material composition of the first semiconductor layer. The lateral variation of the material composition in this case is effected within the same material system. A variation of the material composition may mean a gradient of a proportion of one or more constituents of the first semiconductor layer along the at least one direction of extent. In simple terms, the proportion of at least one constituent increases or decreases because of a temperature-dependent incorporation of the constituents of the material composition of the first semiconductor layer. The first semiconductor layer therefore has at least two regions, laterally adjacent to each other, which are based on the same material system and which have differing material compositions. The transition of the material composition, i.e. the gradient of a proportion of one or more constituents of the first semiconductor layer, from a first of these regions to a second of these regions, may be abrupt, i.e. insofar as technically possible, stepped, or also continuous. The layer thickness of the first semiconductor layer may particularly preferably be constant. In other words, the at least two regions arranged laterally adjacent to one another, which have differing material compositions, may have a same thickness. A "same" or "constant" thickness may mean in particular here that the thickness of the first semiconductor layer, regardless of a varying material composition, varies by not more than 10% or by not more than 5% or particularly preferably by not more than 1%.

The difference in the material composition, and consequently the difference in the proportion, of one or more constituents of the first semiconductor layer in the at least two laterally adjacent regions may be such, in respect of a respective proportion, averaged in the regions, of the one or more constituents, that a first region has a proportion of one or more constituents of the material composition of, for example, less than or equal to 99%, or less than or equal to 97%, or less than or equal to 95%, or less than or equal to 90%, or less than or equal to 85%, or less than or equal to 80%, or less than or equal to 75%, or less than or equal to 50%, or less than or equal to 25%, in comparison with a second region, or vice versa. The proportion of the constituents of the material composition in this case may preferably be specified in relation to the chemical summation formula.

For example, in the case of an InAlGaN material system, the incorporation of one or more semiconductor crystal constituents, in particular of indium, can be varied in the manner described by an inhomogeneous lateral temperature distribution in the lateral direction. Thus, a first semiconductor layer based on the InAlGaN material system may have a first region having the composition $In_xAl_yGa_{1-x-y}N$, and a second region having the composition $In_aAl_bGa_{1-a-b}N$, wherein it may be the case that $x \leq 0.99a$ or $x \leq 0.97a$ or $x \leq 0.95a$ or $x \leq 0.90a$ or $x \leq 0.85a$ or $x \leq 0.80a$ or $x \leq 0.75a$ or $x \leq 0.50a$ or $x \leq 0.25a$. Alternatively or additionally, the Al component and/or the Ga component may also vary correspondingly in the manner described. The composition in the regions may be, in particular, a composition averaged over the respective region. Likewise, in the case of other semiconductor material systems such as, for instance, InAlGaP or InAlGaAs, the incorporation of one or more constituents, i.e. for example the proportion of In and/or the proportion of Ga and/or the proportion of Al, can be varied by the inhomogeneous lateral temperature distribution.

In particular, the inhomogeneous lateral temperature distribution is present over at least one region on the growth substrate that corresponds to a future semiconductor chip. This means, in other words, that the first semiconductor layer is grown in a region on the growth substrate that corresponds to a semiconductor chip, and along at least one direction of extent has an inhomogeneous material composition that is created by the inhomogeneous lateral distribution during the growth process. Accordingly, the inhomogeneous lateral temperature distribution may recur periodically over the growth substrate, along the at least one direction of extent, according to the sequence of regions on the growth substrate that correspond to a plurality of semiconductor chips, such that a multiplicity of semiconductor chips, having the same, or at least substantially the same, lateral variations of the material composition of the first semiconductor layer, can be produced on-wafer. In the case of the method described here, therefore, an inhomogeneous lateral temperature distribution is selectively created during the growth process for growing the first semiconductor layer, such that a selective lateral variation of the material composition of the first semiconductor layer can be created.

The inhomogeneous lateral temperature distribution may effect a first temperature range and a second temperature range, which have a temperature difference of greater than or equal to 1 K, or greater than or equal to 2 K, or greater than or equal to 5 K, or even greater than or equal to 10 K. The transition from the first to the second temperature range may be abrupt, i.e. insofar as technically possible, substantially stepped, or continuous, according to a desired temperature profile.

Different local material compositions of the first semiconductor layer may lead to laterally varying band gaps, absorption coefficients and/or refractive indices in the material of the first semiconductor layer. In the case of an active semiconductor layer provided for light generation, a laterally varying material composition may thus lead in particular to the generation of laterally varying wavelengths of the light radiated during operation of the semiconductor chip. In contrast to the method described here, it is attempted instead in known epitaxial deposition methods to even out temperature variations and inhomogeneities described previously, in order to obtain the most uniform temperature distribution possible over the entire surface of a growth substrate wafer if possible, so that the material compositions of the growing layers do not vary if possible in a lateral direction, in order to minimize the described variations of the absorption coefficient, the refractive index and in particular the wavelength of the light generated in operation from semiconductor chip to semiconductor chip.

The optical and electrical properties and in particular the wavelength of light-emitting semiconductor chips depend heavily, as described, on the growth temperature during the growth of the semiconductor layers. In the case of conventional wafer-based epitaxial processes, there may be undesired temperature differences over the entire wafer, resulting in differing properties of semiconductor chips singulated from the wafer. In this case, there may be temperature differences of some kelvins between regions of the wafer that are at a distance from one another, of which, however, the order of magnitude and distance is far larger than the semiconductor chips to be produced.

It is normally attempted, therefore, by a setting of various heaters in the reactor used for the growth process, to produce the most uniform temperature distribution possible over a wafer disc. However, the problem arises here that only a few heaters are available in the reactor and due to this only a large-scale temperature profile can be set. An additional complication is that several wafers normally lie in a carrier at the same time and the temperature distribution of each individual wafer depends on how this lies on the carrier in the contact region provided, the so-called "pocket" on the carrier. Different contact regions may vary slightly in this case, which may lead to only a lower wafer-to-wafer homogeneity. In addition, the wafers are stressed during the growth process, which results in a layer-thickness-dependent curvature of the wafer. This curvature in turn effects a different thermal coupling to the carrier, so that the temperature varies in an uncontrolled manner over the wafer: where the wafer rests better it is hotter, where the distance from the carrier is greater due to the curvature, it is colder. Since the curvature depends on the actual layer thickness and the material composition of the grown layers, the local temperature distribution changes constantly on the wafer during the growth process and thus also between various epitaxial structures. The heating and the carrier profile are therefore normally set so that they are suitable for one working point, thus for a certain epitaxial design and, in relation to this, in particular for the growth of the active layer. By contrast, a locally adjustable temperature distribution is not possible in the prior art.

In the case of conventional growth methods, the adjustable temperature distribution over a distance, in particular, that corresponds to a chip extent is substantially homogeneous, such that, in the case of conventional methods, the semiconductor layers of the semiconductor chip are grown with homogeneous material compositions in the lateral direction, at least over an order of magnitude that corresponds to the chip size. In contrast to this, in the case of the method described here, an inhomogeneous lateral temperature distribution is selectively created on a length scale that is in the order of magnitude of the chip dimensions, in order to create an associated inhomogeneous material composition in at least the first semiconductor layer within the semiconductor chip. Unlike the conventional epitaxial processes, in the case of the method described here a temperature difference is thus produced on a length scale that corresponds to an extent of the semiconductor chip, or less, such that an inhomogeneous material composition is created, within a semiconductor chip, in at least the first semiconductor layer.

The first semiconductor layer is particularly preferably at least part of an active layer of the semiconductor chip provided for light generation, so that the laterally varying material composition of the first semiconductor layer may effect different emission wavelengths. The first semiconductor layer may thus have at least a first region and laterally adjacent to this a second region, which are based on the same material system and have different material compositions from one another. The transition from the first to the second region may be stepped, ramped or otherwise continuous. Moreover, the first semiconductor layer may have more than two laterally adjacent regions with different material compositions. It may be possible due to this for the semiconductor chip having the first semiconductor layer to radiate light of different wavelengths when different regions are in operation. The inhomogeneous lateral temperature distribution during the growth of the first semiconductor layer can thus result in a lateral wavelength distribution of the light emission in the subsequent operation of the semiconductor chip.

According to a further embodiment, the semiconductor chip is embodied as a light-emitting semiconductor chip in the form of a semiconductor laser diode. In particular, the semiconductor chip may have a radiation outcoupling surface in the form of a facet, via which light is radiated in operation of the semiconductor chip. The semiconductor chip may have, in the manner described above, a first semiconductor layer embodied as an active layer with several, thus at least two, laterally adjacent regions with differing material compositions, so that light of different wavelengths may be radiated via the facet in operation via different adjacent facet regions. Each of the regions of the first semiconductor layer with the differing material compositions may be part of a laser strip, which may also be described as a laser bar and which may be defined by a corresponding contact region or additionally a corresponding ridge wave structure. The semiconductor chip may accordingly be embodied as so-called laser bars or as a so-called laser array and have several adjacent laser strips, which may emit light of different wavelengths in operation. The laser strips may be electrically controllable jointly or separately from one another.

According to a further embodiment, the semiconductor chip is embodied as a light-emitting semiconductor chip in the form of a light-emitting diode. In this case the semiconductor chip may have a radiation outcoupling surface, via which light is radiated in operation of the semiconductor chip. The semiconductor chip may have in the manner described above a first semiconductor layer embodied as an active layer with several laterally adjacent regions of different material compositions, so that via the radiation outcoupling surface light of different wavelengths may be radiated via different adjacent radiation outcoupling surface regions in operation. The various emitting regions of the semiconductor chip may be electrically controllable jointly or separately from one another.

The wavelength difference of the light that may be generated in the regions of the first semiconductor layer with the different material compositions can be greater than or equal to 1 nm or greater than or equal to 2 nm or greater than or equal to 5 nm or greater than or equal to 10 nm or greater than or equal to 50 nm or greater than or equal to 100 nm. For example, in operation a first region of the first semiconductor layer may be set up to emit blue light and a second region to emit green light or yellow light or red light. Moreover, several, thus two or more regions may exist of which the emission wavelengths differ and lie in a wavelength range from blue to green, green to yellow, blue to yellow, blue to red, green to red or yellow to red.

According to a further embodiment, at least two or more light-emitting semiconductor chips are combined with one another in a light-emitting apparatus. Moreover, it may be possible that a light-emitting apparatus has at least one light-emitting semiconductor chip and a wavelength conversion element, by which at least part of the light emitted by the semiconductor chip in operation may be converted into light of another wavelength.

According to a further embodiment, the inhomogeneous lateral temperature distribution is selectively created, during the growing of the first semiconductor layer, by local thermal influencing of predefined and specifically selected regions. In particular, the inhomogeneous lateral temperature distribution may be created, at least partly, by a temperature distribution structure and/or by a locally varying light irradiation. The measures described here for creating the inhomogeneous lateral temperature distribution are used, in particular, in addition to the commonly used, locally non-controllable epitaxial heating systems.

The locally varying light irradiation may comprise, for example, irradiation with a laser that radiates light onto the growing first semiconductor layer, in predefined and selectively selected regions, which light, as a result of absorption in the growing first semiconductor layer, or in a layer underneath it such as, for example, an already grown layer and/or a growth substrate, results in a local and inhomogeneous heating in these regions, such that, for the growing first semiconductor layer, differing effective growth temperatures prevail in differing regions. The light irradiation thus has, in particular, at least one spectral component that can be absorbed in the first semiconductor layer and/or in a layer or structure arranged beneath it in the direction of growth, such as, for instance, the temperature distribution structure. The locally varying light irradiation may be realized, in particular, such that one or more regions, the areal extents of which are smaller than those of the semiconductor chip, can be irradiated simultaneously or in succession on the growth substrate.

Furthermore, the light irradiation may be effected in a pulsed manner. Pulsed irradiation, particularly in combination with a moving, for example rotating, growth substrate, may be used to irradiate predefined, separate regions, which move through under the light beam. Furthermore, light may be selectively deflected onto predefined regions by a light deflecting means, for example from or by means of a mirror. These measures make it possible to scan the surface on which the first semiconductor layer is grown. It is possible in this case that an individual light beam, in particular a single laser beam, is used. Alternatively or additionally, it is possible to use a plurality of light sources that can be operated synchronously or independently of one another, in particular a plurality of laser light sources that can be operated synchronously or independently of one another, to generate a locally varying light irradiation, which light sources, according on their operation, being able, for example, to illuminate and thereby locally heat a plurality of regions.

The described local heating, based on light irradiation, for controlling the temperature distribution may furthermore be coupled to the in-situ measuring instruments that are usually present in the growth reactor, i.e. temperature measuring instruments and/or measuring instruments for measuring the wafer curvature, such that, for each growth substrate, the light power radiated onto the growth substrate can be locally adapted, for example on the basis of the instantaneous curvature data based on a curvature measurement and/or on the basis of a spatially resolved temperature measurement, such that, in a first step, the temperature profile can be homogenized during the growing phase, in particular each phase of growth. The homogenization in this case can balance out temperature differences on the growth substrate, as well as between a plurality of growth substrates provided simultaneously in the reactor for coating. In a second step, a modulation can be selectively applied to the homogenized temperature profile, such that the desired lateral inhomogeneous temperature distribution can be created on the growth substrate, thereby making it possible to effect the desired regions of the first semiconductor layer having differing material compositions. The second step may additionally be further improved in that special markings, in the form of adjustment or trigger markings, are applied to the growth substrate, in particular before the procedure. These markings can be detected during the growing process, in the course of the light irradiation, such that the temperature profile can be adjusted to these markings. This makes it possible, in the further course of the production process, for the regions having the different material compositions, and consequently the different wavelength ranges, to be accurately assigned to the chip structures.

The temperature distribution structure may have at least one temperature distribution structure element, which effects a local increase or reduction of the temperature of the growing first semiconductor layer. The temperature distribution structure element may have, at least along one direction of extent, a lateral extent that is less than a lateral extent of the semiconductor chip, such that the local temperature change can be effected in a sub-region of the semiconductor chip. In particular, the temperature distribution structure may have a plurality of temperature distribution structure elements, which are arranged regularly and/or periodically in the lateral direction, according to the intended inhomogeneous lateral temperature distribution profile. The temperature distribution structure element or elements may be embodied, for example, in the form of mutually separate islands and/or line structures.

The temperature distribution structure mentioned in the following description may represent one temperature distribution structure element or a plurality of temperature distribution structure elements. In particular, the following embodiments and feature relating to the temperature distribution structure may be combined with one another, such that there may be temperature distribution structure elements that differ from one another and that, in combination, can effect the desired temperature distribution.

According to the desired temperature-changing effect of the temperature distribution structure, the latter may have, or be composed of, a dielectric material, semiconducting material, metal, or a plurality thereof or combination therewith. Dielectric materials can effect, for example, local influencing of the thermal conductivity and thereby, as a result of an improved or reduced delivery or removal of heat, a local raising or lowering of the temperature in the growing first semiconductor layer. Semiconducting and metallic materials can likewise influence the thermal conductivity and/or be selectively heated by irradiation by light or other suitable electromagnetic radiation such as, for example, microwave radiation. The electromagnetic radiation may be radiated, for example, uniformly and over a large area, or in a locally varying manner.

The temperature distribution structure may have, or be composed of, for example, a material that differs from the growth substrate. Furthermore, it is also possible for the temperature distribution structure to have a material that is the same as the growth substrate. In particular, in this case, the temperature distribution structure and the growth substrate may be formed in one piece.

According to one embodiment, the temperature distribution structure is arranged on a side of the growth substrate that faces away from the first semiconductor layer. In other words, the growth substrate has a rear side, on which the temperature distribution structure is arranged, and a front side, on which the first semiconductor layer is grown. Alternatively or additionally, it is also possible for the temperature distribution structure to be arranged on a side of the growth substrate that faces toward the semiconductor layer. In this case, the temperature distribution structure may be arranged beneath the growing first semiconductor layer, in the direction of growth, and thus between the growth substrate and the first semiconductor layer. Alternatively or additionally, it may furthermore be possible for the temperature distribution structure to be embedded in the growth substrate and/or in a semiconductor layer on the growth substrate.

It may be particularly advantageous if the temperature distribution structure is arranged in direct contact with the growth substrate. This may mean, in particular, that the temperature distribution structure is arranged in an embedded manner directly on the rear side and/or the front side of the growth substrate or, also, in the growth substrate.

According to a further embodiment, the temperature distribution structure is covered, at least partly, by a protective layer. This may mean that the temperature distribution structure, as viewed from the growth substrate, is covered by a protective layer, and/or that there is a protective layer arranged between the temperature distribution structure and the growth substrate. If the temperature distribution structure is covered on all sides by a protective layer, then, in particular, it may be embedded in the protective layer. The protective layer may be provided and embodied, in particular, such that the growth process during the growing of the first semiconductor layer, and in particular the semiconductor layer sequence having the first semiconductor layer, are not negatively influenced by the temperature distribution structure. For example, outgassing or vaporization of material of the temperature distribution structure can be prevented by the protective layer.

According to a further embodiment, the temperature distribution structure and/or the protective layer remain, at least partly, or also entirely, in the completed semiconductor chip. This may be the case, for example, if the temperature distribution structure is arranged on the side of the growth substrate that faces toward the first semiconductor layer, or is embedded in the growth substrate, and the growth substrate remains, at least partly, in the semiconductor chip. Furthermore, it is also possible for the temperature distribution structure to be arranged on the rear side of the growth substrate that faces away from the first semiconductor layer, and for the growth substrate, together with the temperature distribution structure, to remain in the semiconductor chip. As an alternative to this, it may also be the case that the temperature distribution structure does not remain, or remains only partly, in the semiconductor chip, and is removed, at least partly, or completely, before completion of the semiconductor chip. For example, an at least partial or complete removal of the temperature distribution structure may be effected in the course of an at least partial removal, i.e. thinning, or complete removal of the growth substrate.

According to a further embodiment, the temperature distribution structure is embodied for selective local heating of regions of the growing first semiconductor layer. In this case, the one temperature distribution structure element or the plurality of temperature distribution structure elements may be embodied as heating elements. For example, a temperature distribution structure element embodied as a heating element may have a material, in particular a semiconductor or a metal, that absorbs electromagnetic radiation. Furthermore, the one temperature distribution structure element or the plurality of temperature distribution structure elements may be embodied as temperature conducting elements, which are more able than a laterally adjacent material, i.e. for example the growth substrate or a semiconductor layer, to conduct a heat, provided by a carrier that carries the growth substrate, to the growing first semiconductor layer.

According to a further embodiment, the temperature distribution structure is embodied for selective local reduction of the temperature of regions of the growing first semiconductor layer. In this case, the one temperature distribution structure element or the plurality of temperature distribution structure elements may be embodied as thermal barrier elements, which are less able than a laterally adjacent material, i.e. for example the growth substrate or a semiconductor layer, to conduct a heat, provided by a carrier that carries the growth substrate, to the growing first semiconductor layer.

According to a further embodiment, a temperature distribution structure element or a plurality of temperature distribution structure elements each have an elevation and/or a recess in the growth substrate. Alternatively, the one temperature distribution structure element or the plurality of temperature distribution structure elements may be applied to the growth substrate and, together with the latter, each form an elevation and/or recess. For example, a temperature distribution structure element may have a recess, in or on the growth substrate, arranged in which there is a thermal barrier material having a lesser thermal conductivity than the growth substrate. Alternatively or additionally, it is also possible for a temperature distribution structure element to have or form an elevation in the growth substrate. Such topographically embodied temperature distribution structure elements may be used, for example, to effect a selectively locally varying thermal coupling to a carrier, on which the growth substrate is arranged.

According to a further embodiment, the protective layer has a dielectric material. For example, the protective layer may be formed by an oxide and/or nitride and/or oxynitride with a metal and/or a metalloid, for example silicon oxide, titanium oxide, aluminum nitride and/or aluminum oxide. In order to achieve an optimal protective effect, it may be advantageous if the protective layer is applied by a method that allows formation of a layer that is as sealed as possible. An atomic layer deposition method, for example, may be advantageous for this purpose.

The production of extremely compact constructions is possible by the method described here, as multi-wavelength-emitting light-emitting diodes or laser diodes may be integrated monolithically within a semiconductor chip. With respect to laser bars or laser arrays embodied in such a way, moreover, a high imaging quality may be achieved, as it may be possible that optical components such as deflecting prisms or lens systems, for example, are only required once, so that during assembly such optical components only have to be adjusted once. If suitable wavelength differences are targetedly built into a semiconductor chip embodied as a laser diode, a speckle-reduced projection application may be possible. Moreover, a multi-wavelength-emitting semiconductor chip may offer the opportunity for a compact wavelength-controllable light source. This may in particular be a white light source, for example, with a variable white point based on individually controllable regions of the semiconductor chip and if applicable in combination with wavelength conversion substances. Since for a multi-wavelength-emitting light source described here no or at least significantly fewer individual components have to be assembled, a simplified, inexpensive assembly process may result. Moreover, the parameters may improve, in particular with regard to the performance of laser diodes, as the targetedly controlled temperature distribution during the epitaxial process may lead to reproducible electrooptical properties. Due to the targeted local variation of the temperature during the growth process and thus due to the targeted local variation of the radiation wavelength distribution, which may be repeated on different regions of the growth substrate, the advantages are also yielded of a high component yield and the inexpensive producibility of different emission wavelengths within a semiconductor chip embodied, for example, as laser bars or a laser array or multi-wavelength light-emitting diode chip.

Further advantages, advantageous embodiments and developments are given by the exemplary embodiments described in the following in conjunction with the figures.

Figure 2A:
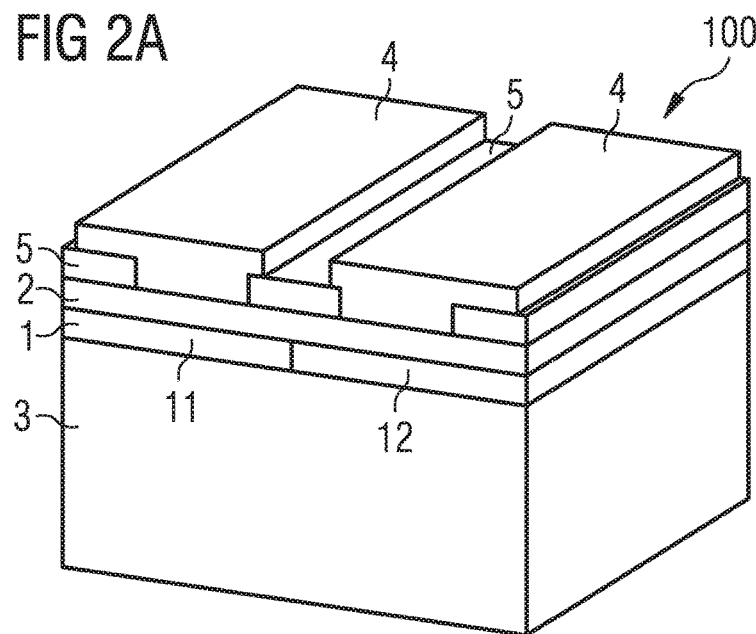
Figure 2B:
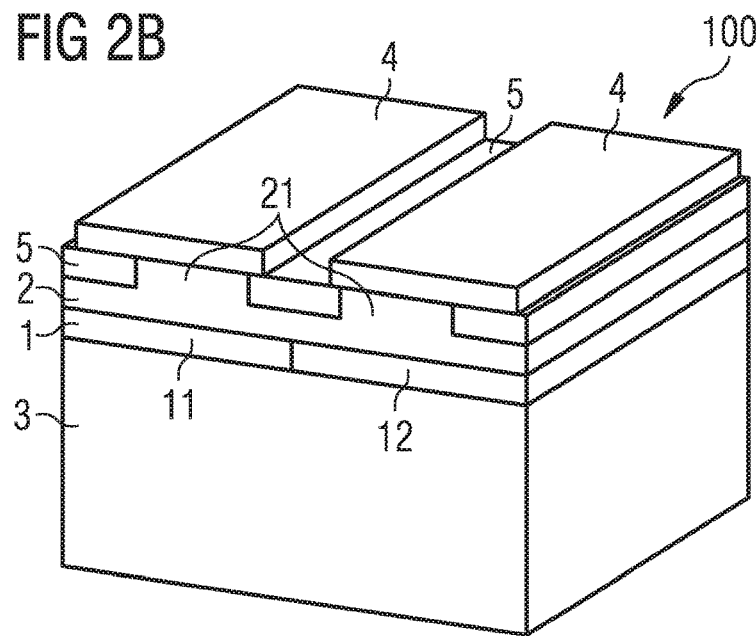
Figure 2C:
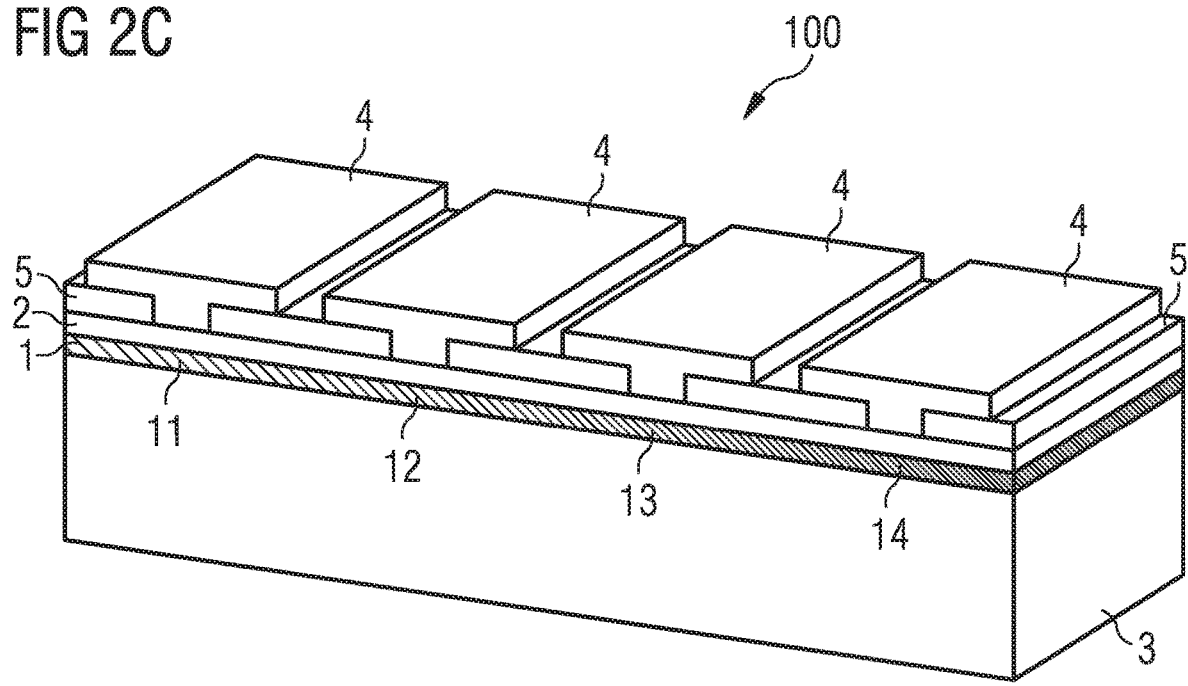
Figure 2D:
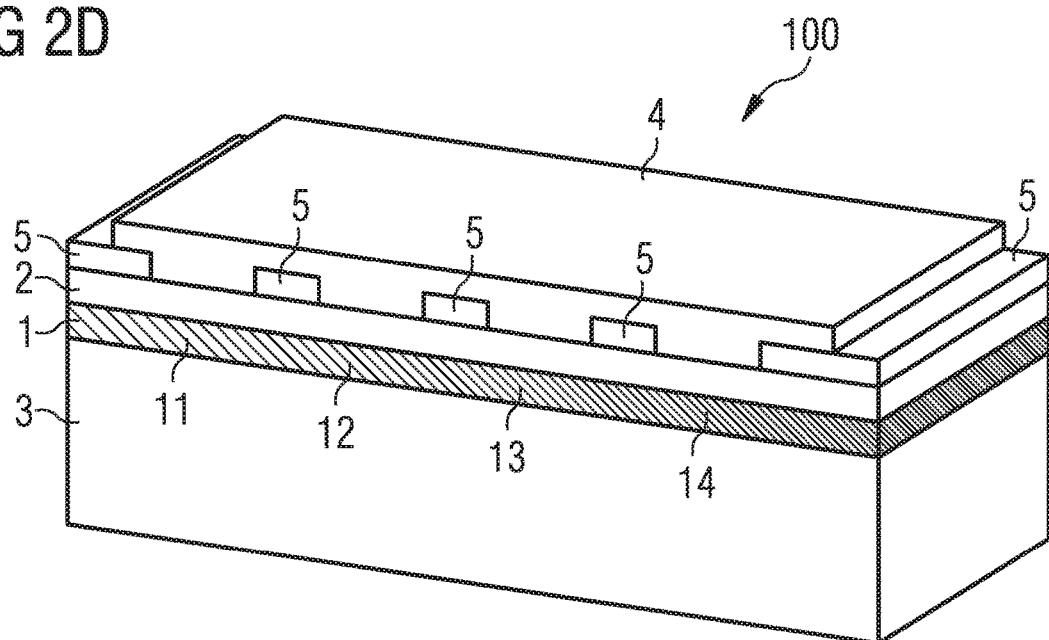
Figure 3A:
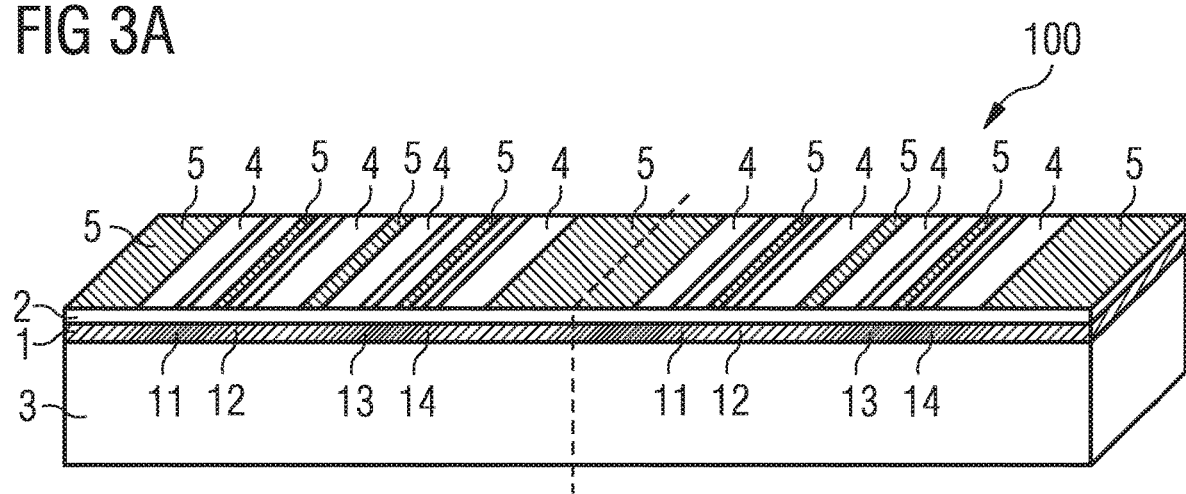
Figure 3B:
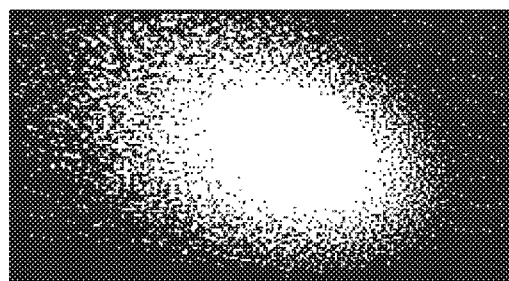
Figure 4A:
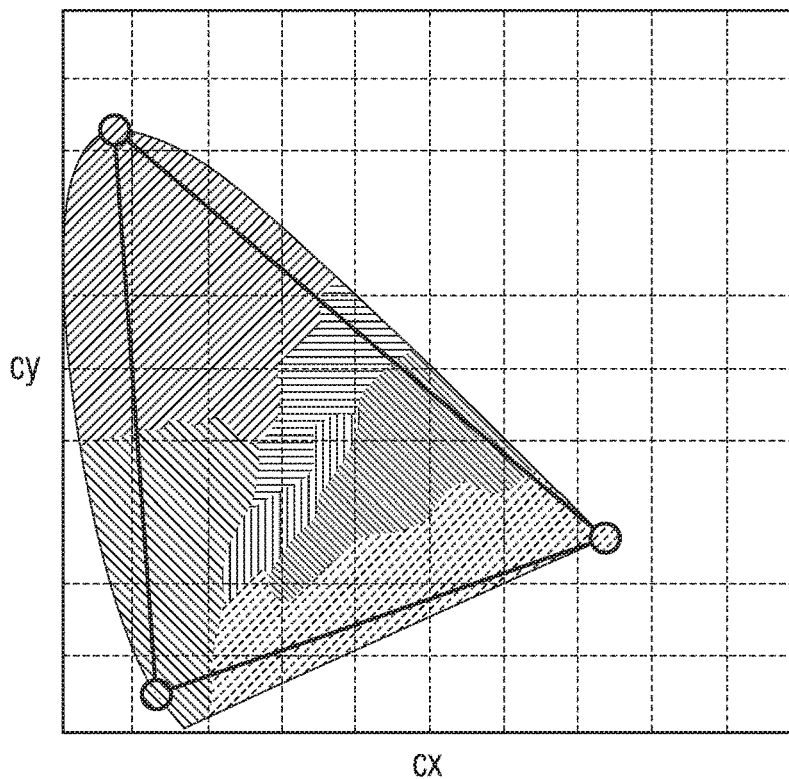
Figure 4B:
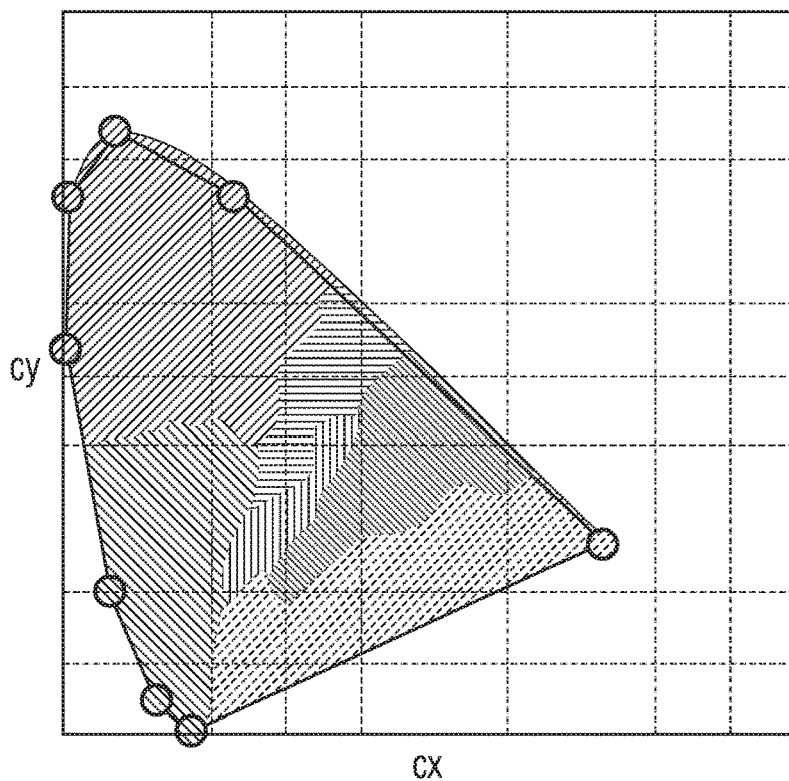

In the figures:

FIG. 1 is a schematic representation of a method for producing a semiconductor chip according to the exemplary embodiment, FIGS. 2A to 3B are schematic representations of semiconductor chips according to further exemplary embodiments, FIGS. 4A and 4B are schematic representations of CIE diagrams, FIGS. 5A to 6B are schematic representations of semiconductor chips according to further exemplary embodiments and FIGS. 7A to 10F are schematic representations of features of methods for producing semiconductor chips according to further exemplary embodiments.

In the exemplary embodiments and figures, elements that are the same, of the same type or have the same effect are in each case denoted by the same references. The elements represented and their relative size ratios are not to be regarded as true to scale, but instead the size of individual elements such as, for example, layers, components, devices and regions may be exaggerated to aid illustration and/or to aid comprehension.

Shown in FIG. 1 is a method for producing a light-emitting semiconductor chip according to one exemplary embodiment, in which the semiconductor chip is produced with a first semiconductor layer having a lateral variation of the material composition. For this purpose, in a first method step 1000, a surface is provided, on which the first semiconductor layer is grown. The first semiconductor layer may preferably be part of a semiconductor layer sequence, which, in addition to the first semiconductor layer, has a plurality of further semiconductor layers. The surface provided for growing the first semiconductor layer may be formed by a growth substrate, or a semiconductor layer that is grown on the growth substrate and that may also be part of an already grown sub-layer stack of the semiconductor layer sequence.

In a further method step 2000, the first semiconductor layer sequence is grown on the provided surface. This may also mean that, before growing of the first semiconductor layer, one or more further semiconductor layers of the semiconductor layer sequence may be grown on the surface. During the growth process for growing the first semiconductor layer, an inhomogeneous lateral temperature distribution is created along at least one direction of extent of the growing first semiconductor layer. The inhomogeneous lateral temperature distribution during the growth process causes a lateral variation of the material composition of the first semiconductor layer. This means, in other words, that the material that is provided and supplied for growing the first semiconductor layer is deposited, in the course of the growth process, on at least two or more surface regions of the provided surface, which have differing temperatures. The composition of the growing material is dependent on the local temperature of the respective surface region, such that the differing temperatures in the at least two or more surface regions result in differing material compositions. Accordingly, the first semiconductor layer has at least two or more regions of differing material compositions, which are arranged laterally next to each other along at least one direction of extent of the first semiconductor layer. The temperature differences between the surface regions of the provided surface many be greater than or equal to 1 K, or greater than or equal to 2 K, or greater than or equal to 5 K, or even greater than or equal to 10 K. Between two adjacent surface regions having differing temperatures, the surface temperature may change abruptly, i.e. insofar as technically possible, substantially in a stepped manner, or continuously, having a desired temperature profile.

In a further method step 3000, following the growing of the first semiconductor layer having the lateral variation of the material composition, the light-emitting semiconductor chip is completed. This may mean, for example, that, inter alia, one or more further semiconductor layers of the semiconductor layer sequence and/or one or more passivation layers and/or one or more contact layers are applied. Alternatively or additionally, other process steps such as, for example, etching processes and other structuring processes, as well as singulation steps for singulating a wafer composite into individual semiconductor chips, are performed.

Further features of the method for producing the semiconductor chip, and further features of the semiconductor chip thus produced, are described in the following figures. The exemplary embodiments described in the following, however, are not to be understood such that they limit the possible method features, and the features of the semiconductor chip produced by the method, only to the features specifically described in the following. Rather, the following exemplary embodiments are to be understood as purely exemplary for possible method features and for features of the semiconductor chips that can be produced by the method.

Exemplary embodiments for light-emitting semiconductor chips 100 are described in conjunction with FIGS. 2A to 6B. The semiconductor chips 100 may be produced, in particular, by a method according to the exemplary embodiment of FIG. 1, i.e. a method in which, during a growth process for growing a first semiconductor layer 1, an inhomogeneous lateral temperature distribution is created along at least one direction of extent of the growing first semiconductor layer 1, such that a lateral variation of a material composition of the first semiconductor layer 1 is produced. The light-emitting semiconductor chips 100 shown thus have a first semiconductor layer 1 that, along at least one direction of extent, has a lateral variation of a material composition resulting from a laterally varying temperature distribution during a growth process.

In the exemplary embodiments shown, the first semiconductor layer 1 is, purely exemplarily, part of a semiconductor layer sequence that, in addition to the first semiconductor layer 1, has, for example, a second semiconductor layer 2 and a third layer 3, between which the first semiconductor layer 1 is arranged. Each of the layers 1, 2, 3 of the semiconductor layer sequence may have one or more layers, or be composed thereof. The layers of the semiconductor layer sequence are arranged on one another along a direction of growth. The direction of growth may also be referred to as the vertical direction. Perpendicularly to the direction of growth, the layers of the semiconductor layer sequence have an extent along directions of extent in the lateral direction, the lateral extent preferably being greater than the thickness of the layers in the vertical direction. The semiconductor layer sequence can be grown, in particular, in the wafer composite, which can subsequently be singulated into a multiplicity of semiconductor chips 100.

For example, the third layer 3 may have a substrate, which may be electrically conductive or electrically insulating, and on which the further layers of the semiconductor layer sequence are applied. The substrate may be a growth substrate, described in the general part above, on which the semiconductor layers of the semiconductor layer sequence are grown by means of an epitaxial growth method such as, for example, MOVPE or MBE. As an alternative to this, the substrate may be a so-called carrier substrate, onto which the semiconductor layers of the semiconductor layer sequence are transferred after having been grown on a growth substrate. Following the growing process, the growth substrate may be thinned or removed completely, such that can also be possible for the layer 3 in the finished semiconductor chip 100 to have no substrate.

In the exemplary embodiments of FIGS. 2A to 6B, the semiconductor chips 100 are embodied, purely exemplarily, as edge-emitting laser diode chips or as light-emitting diode chips having an active layer for generating light. The first semiconductor layer 1 in this case may form, in particular, at least a part of the active layer or even the entire active layer. In other words, the first semiconductor layer 1 may be a part of the active layer, or be the active layer or have this. Furthermore, the first semiconductor layer 1 may also be formed by a plurality of layers that together form at least a part of the active layer or the entire active layer.

In addition to having the first semiconductor layer 1, the semiconductor layer sequence of the semiconductor chip 100 may have further functional semiconductor chips such as, for example, one or more layers selected from waveguide layers, cladding layers, buffer layers and semiconductor contact layers, which may be part of the second semiconductor layer 2 and third layer 3, or which, singly or in combination, may form the second semiconductor layer 2 and the third layer 3 of the semiconductor layer sequence. Furthermore, the first semiconductor layer 1 may also have such layers in addition.

Applied on the semiconductor layer sequence there is contact layer 4, which has a bondable and/or solderable metal, for electrically contacting the semiconductor chip 100. The contact layer 4 may also have a corresponding layer sequence of a plurality of metal layers. The term "metal", apart from denoting a pure metal, may also denote mixtures, alloys and compounds having or composed of a plurality of metals that have properties suitable for electrical contacting and for electrical connection. Suitable metals for the contact layer 4 may be, singly or in combination, one or more selected from gold, aluminum, silver, titanium, platinum, nickel, palladium, rhodium and tungsten.

The semiconductor chip 100 have at least one further contact layer, which for reasons of clarity is not shown in the figures and which, together with the contact layer 4, enable electrical connection of the semiconductor chip 100 to be effected. For example, the third layer 3 may be electrically conductive, and the further contact layer is applied on a side of the third layer 3 that faces away from the first semiconductor layer 1. Alternatively, the further contact layer may be arranged on a correspondingly exposed part of the surface of the semiconductor chip 100, next to the contact layer 4 shown. In at least some exemplary embodiments, the semiconductor chips 100 have, in regions, i.e. in sub-regions between the contact layer 4 and the semiconductor layer sequence, a passivation layer 5, which electrically insulates a part of the surface of the semiconductor layer sequence against the contact layer 4. The passivation layer 5 may be, or be composed of, for example, an electrically insulating oxide, nitride or oxynitride, or a combination of such materials. For example, the passivation layer may have one or more of the following materials: aluminum oxide, silicon oxide, silicon nitride, silicon oxynitride, titanium oxide. The passivation layer 5 makes it possible to provide a contact layer 4 having a large contact surface, which is large enough for external electrical contacting of the semiconductor chip 100, for example by means of a soldered connection or a bond wire, while the semiconductor layer sequence is electrically connected, in a smaller region, by the electrical contact layer 4. The contact region between the contact layer 4 and the semiconductor layer sequence may define, in particular, the region of the active layer in which it is sought to generate light, and may be embodied accordingly, for example in the form of a strip. In the case of laser diode chips, the strip-type contact region may preferably extend from a front side face of the semiconductor layer sequence, which forms a coupling-out facet for light emission, to an oppositely located, rear side face of the semiconductor layer sequence, which forms a reflective rear-side facet. Appropriate layers such as, for example, partially or fully reflective layers, and layer combinations, according to the required functionalities, may be applied on the facets.

Purely exemplarily, the first semiconductor layer 1, and preferably the semiconductor layer sequence of the semiconductor chip 100, are based on the III-V compound semiconductor material system InAlGaN, described above in the general part. Thus, in the exemplary embodiments shown, the material composition of the first semiconductor layer 1 in this case may vary in the lateral direction with respect to at least one of the crystal constituents of InAlGaN. Particularly preferably, the material composition varies with respect to the indium content, which is particularly dependent on the growth temperature. Thus, in the case of usual growth temperatures, the incorporated indium content may become less as the growth temperature increases, such that, in regions of the growing first semiconductor layer 1 in which there prevails a lesser growth temperature, in comparison with other regions, it is possible to effect a greater incorporation of indium and, consequently, a resultant greater indium content.

In dependence on the lateral variation of the material composition along at least one direction of extent, properties of the first semiconductor layer 1 may vary along this direction of extent. In the material system InAlGaN, for example, a higher indium content may result in a higher refractive index, a reduction of the band gap and an increase of the optical absorption. Correspondingly, a higher indium content may result in a reduction of the refractive index, an increase of the band gap and a reduction of the optical absorption. By an adjustment of the band gap of the first semiconductor layer 1, in particular the corresponding wavelength of the light generated in the semiconductor layer sequence may also be adjusted.

The layer thickness of the first semiconductor layer 1 in the exemplary embodiments shown may particularly preferably be constant, as shown in the figures. In particular, the thickness of the first semiconductor layer 1 may vary independently of the material composition of different regions, as described below, by not more than 10% or by not more than 5% or particularly preferably by not more than 1%.

The light-emitting semiconductor chip 100 shown in FIG. 2A is embodied as a laser diode chip and has a semiconductor layer 1 having regions 11, 12 arranged laterally next to one another that have a differing material composition. The first region 11 and the second region 12 are embodied in the form of a strip along the direction of the contact regions arranged above them between the semiconductor layer sequence and the contact layers 4 and adjoin one another in a lateral direction transversely to the direction of extent of the strips. As viewed towards the outcoupling facet or the rear-side face of the semiconductor chip 100, the regions 11 and 12 are thus arranged next to one another and are constituents of two laser strips, which can be controlled separately from one another via the contact layers 4. The light-emitting semiconductor chip 100 is embodied accordingly as a multi-oxide-strip laser.

The first region 11 has a greater indium content than the laterally adjacent second region 12, so that the region 12 has a greater band gap than the region 11. The laser strip having the first region 11 therefore generates light of a greater wavelength than the laser strip with the second region 12 in operation of the light-emitting semiconductor chip 100. Due to this it is possible, via the facet in adjacent facet regions, which correspond to the laser strips, to radiate laser light of different wavelengths. The light-emitting semiconductor chip 100 thus has two monolithically integrated laser strips, which may be controlled independently of one another in the exemplary embodiment shown and which may radiate laser light of different wavelengths. Depending on the difference in the material composition of the first region 11 and the second region 12 set by the production method described above, the wavelengths of the respectively radiated laser light may vary by greater than or equal to 1 nm or by greater than or equal to 2 nm or by greater than or equal to 5 nm or by greater than or equal to 10 nm or by greater than or equal to 50 nm or by greater than or equal to 100 nm.

The transition from the first to the second region 11, 12 may, as indicated in FIG. 2A by the borderline between the regions 11, 12, be abrupt and thus stepped. Alternatively to this, the transition can also be continuous, thus in the form of a ramp, for example. In the region of the laser strips the respective material composition of the regions 11, 12 may be homogeneous. Alternatively to this it may also be possible that the material composition in the first semiconductor layer 1 changes continuously both within the regions 11, 12 and in the transition between these, so that a continuous change of the material composition may exist in the first semiconductor layer 1 in a lateral direction. Alternatively to the first exemplary embodiment, moreover, it is also possible to control the two laser strips together via a common contact layer 4. Furthermore, it may also be possible that the first semiconductor layer 1 has more than two regions arranged laterally next to one another with different material compositions, so that an emission of laser light of several different wavelengths from several facet regions is possible. Such features and other features are also described in connection with some of the following exemplary embodiments.

In FIG. 2B a semiconductor chip 100 is shown that substantially corresponds to the exemplary embodiment in FIG. 2A, but in contrast to this has above the first semiconductor layer 1 a second semiconductor layer 2, which has a ridge waveguide structure 21 over the regions 11, 12 in each case for the definition of the respective laser strip, which structure can also be described as a so-called "ridge". Ridge structures of this kind, which may lead to an index guiding of the light generated in the particular laser strip, are known in the prior art and are therefore not explained further here. The semiconductor chips 100 shown below and embodied as laser diodes can be embodied, alternatively to the embodiment shown as multi-oxide-strip lasers, as multi-ridge lasers with such ridge waveguide structures.

In FIG. 2C the light-emitting semiconductor chip 100 shown has more than two laser strips, namely purely exemplarily four laser strips, which are defined by the corresponding contact regions between the contact layers 4 and the semiconductor layer sequence. The first semiconductor layer 1 accordingly has regions 11, 12, 13, 14 arranged laterally adjacent to one another in the exemplary embodiment shown, which regions have different material compositions. As indicated in FIG. 2C, the material composition changes within the first semiconductor layer 1 continuously in the lateral direction transversely to the direction of extension of the laser strips, so that a targetedly controlled wavelength progression may be effected with regard to the regions 11, 12, 13, 14 and the corresponding laser strips.

An exemplary embodiment of a light-emitting semiconductor chip 100 is shown in FIG. 2D that is embodied like the light-emitting semiconductor chip 100 of the previous exemplary embodiment, but in contrast to this has a common contact layer 4 for the simultaneous contacting and control of the laser strips. The exemplary embodiments shown below of semiconductor chips 100 embodied as laser diodes can likewise have such common control of the laser strips.

Due to the monolithic integration shown of two or more laser strips within a light-emitting semiconductor chip with different emission wavelengths, light sources of a high compactness, improved yield and reduced manufacturing costs are possible compared with normal multi-chip solutions. As described in connection with the following exemplary embodiments, an improved laser performance, higher imaging quality and reduced laser speckle may result due to the monolithic integration of several laser strips emitting in different wavelengths.

In connection with FIGS. 3A and 3B, a light-emitting semiconductor chip 100 according to a further exemplary embodiment and a speckle pattern of such a semiconductor chip 100 are shown. The semiconductor chip 100 shown corresponds substantially with regard to its construction to a doubling of the light-emitting semiconductor chip 100 described in connection with FIG. 2C. The two units of the exemplary embodiment shown in FIG. 3A, corresponding to the semiconductor chip 100 of the exemplary embodiment of FIG. 2C, are indicated by a dashed line. The light-emitting semiconductor chip 100 shown in FIG. 3A can be a projection light source, for example, which corresponding to the previous description has several monolithically integrated laser emitters in the form of the laser strips with the regions 11, 12, 13, 14 of the first semiconductor layer 1, which may emit light of wavelengths differing from one another, for example in a green wavelength range or wavelength range of a different color. The difference in the emission wavelengths of adjacent laser strips may thus be in the range of one or a few nanometers. Due to such slightly different wavelengths of the single emitters, a speckle reduction may be achieved compared with conventional laser bars, which have single emitters that all emit at the same wavelength. Moreover, the semiconductor chip 100 shown is characterized by a compact, monolithically integrated arrangement of the projection light source and a simple assembly and lens adjustment associated with this.

In the FIGS. 4A and 4B, CIE chromaticity diagrams known to the person skilled in the art are shown, in which some exemplary color coordinates are entered, which may be used in projection applications, for example, to cover the projection color space. The three color coordinates entered in FIG. 4A in the blue, green and red wavelength range correspond in this case to the usual combination of three single laser diodes with corresponding emission wavelengths in known projection applications. It is easily apparent that by such a combination of three light sources, color components for yellow, cyan and pink, for example, are missing.

If more light sources are used, for example eight light sources as shown in FIG. 4B, the emission wavelengths of which are different, it may be possible to cover virtually the entire color space. In the example shown, laser emissions in three different blue wavelengths, in four different green wavelengths and one red wavelength are combined. The blue and green emissions can, as described above and also below, be produced respectively by light-emitting semiconductor chips 100, which have several monolithically integrated laser strips with different emission wavelengths, so that as is normal in the prior art only three laser diode components have to be used, but these may cover a much greater color space on account of differently emitting, monolithically integrated laser strips. Such configurations may also be advantageous for displays and for lighting applications with good color reproduction, for example, as well as projection applications. Other advantageous light-emitting semiconductor chips 100 are described in connection with the following FIGS. 5A to 6B.

Figure 5A:
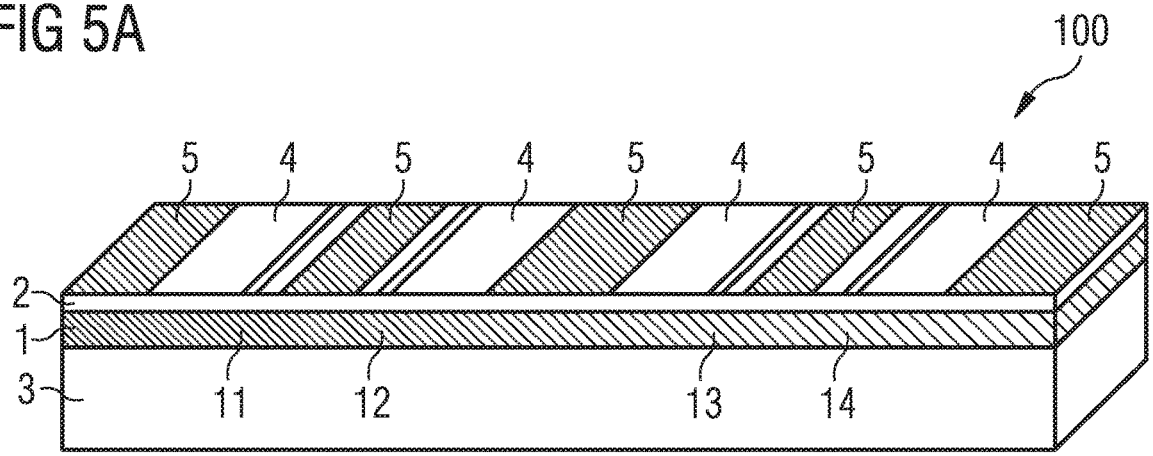

In FIG. 5A, a light-emitting semiconductor chip 100 is shown, which corresponds substantially to the semiconductor chip 100 described above in connection with FIG. 2C and which may be used with regard to an illumination light source with a high color rendering index. Since the narrow spectra typical of laser light sources tend to be disadvantageous for a high color rendering index, the laser strips of the semiconductor chip 100 having the regions 11, 12, 13, 14 of the first semiconductor layer 1 can be embodied so that they have slightly different emission spectra, for example, in different blue tones or different green tones or different red tones. A broad spectrum advantageous for a high color rendering index may therefore be produced by the light-emitting semiconductor chip 100. An illumination light source may contain several such light-emitting semiconductor chips 100 with corresponding spectra in different colors and have the advantage of simplified assembly and lens adjustment on account of the compact monolithically integrated embodiments of the semiconductor chips 100 used.

Figure 5B:
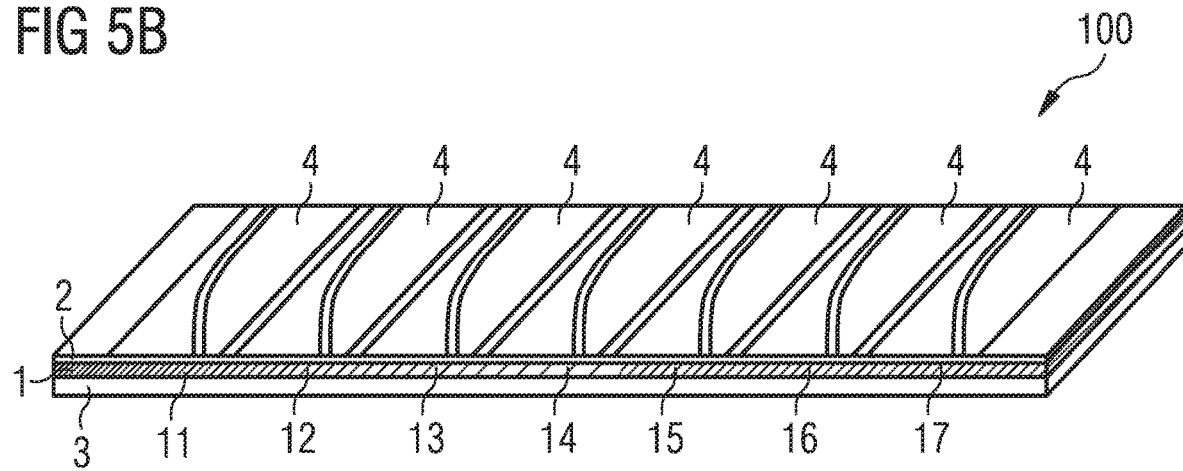

A light-emitting semiconductor chip 100 is shown in FIG. 5B that, compared with the laser light sources shown in the previous exemplary embodiments, is embodied as a so-called superluminescence diode, in which the contact regions between the contact layers 4 and the semiconductor layer sequence have a correspondingly suitable form, as indicated in FIG. 5B. In such a semiconductor chip 100 it is possible to combine the monolithic integration of different emission spectra on one chip with a broader emission spectrum compared with a laser, due to which a very broadband light source can be achieved, which also has the advantage of a directed radiation.

Figure 5C:
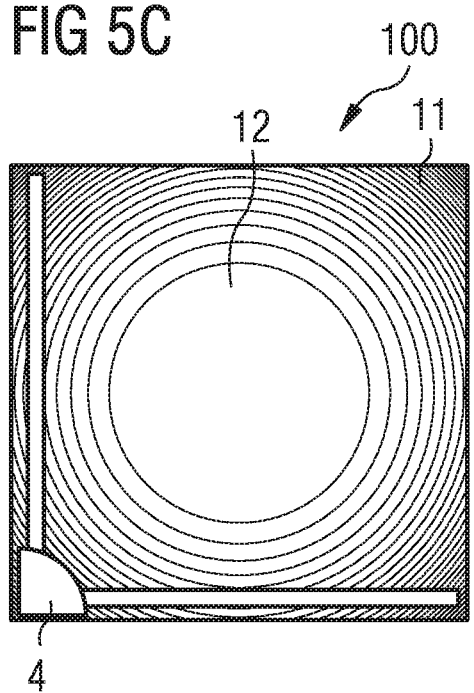
Figure 5D:
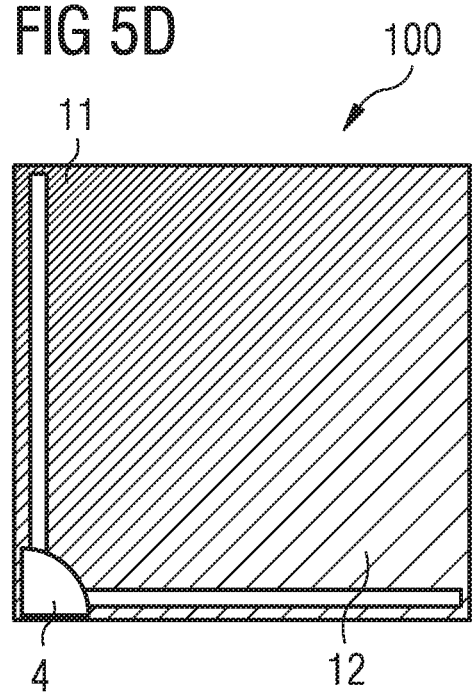
Figure 5E:
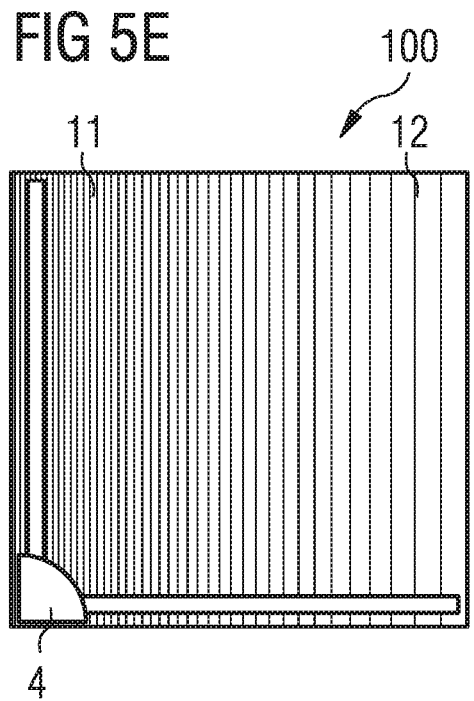
Figure 5F:
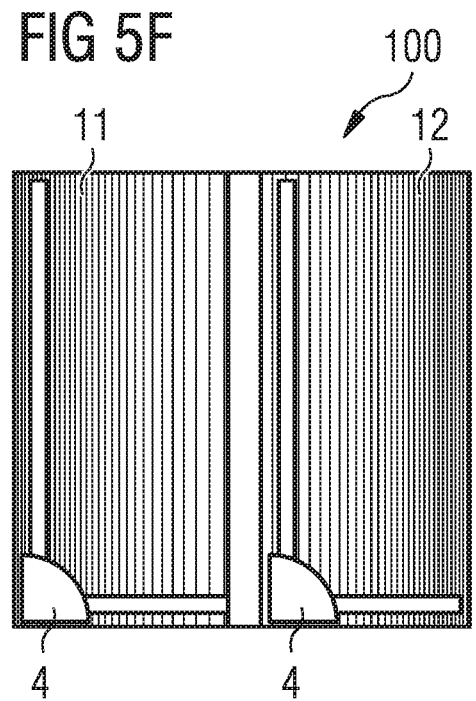

In combination with FIGS. 5C to 5F, exemplary embodiments of light-emitting semiconductor chips 100 are shown that are embodied as light-emitting diode chips. The semiconductor chips 100 are illustrated in each case in a top view of a radiation outcoupling surface, which corresponds to the top side of the chip. Furthermore, the arrangement of the regions 11, 12 of the first semiconductor layer with the different material composition and correspondingly resulting different wavelength of the emitted light is indicated. As shown in FIG. 5C, a first region 11 can radially surround a second region 12, for example. Continuous progressions of the material compositions from opposing corners or sides of the semiconductor chip 100 are also possible, for example, as shown in FIGS. 5D and 5E. The differently emitting regions can be controlled separately from one another by separate contact layers 4, as shown in FIG. 5F, so that different colors can be controlled separately from one another. Monolithically integrated multicolored light-emitting diode chips may be realized by this for displays or color-coordinatable light sources, for example, which chips offer the advantages of small size and low-cost production.

Similar to the construction of the exemplary embodiment shown in FIG. 5F of a light-emitting semiconductor chip 100 embodied as a segmented light-emitting diode chip, a light-emitting semiconductor chip may, according to a further exemplary embodiment, also be embodied as a one- or two-dimensional array of surface-emitting semiconductor lasers (VCSEL: "vertical-cavity surface-emitting laser"), thus as strips or as a matrix of a plurality of VCSEL elements, which are embodied in different regions of the first semiconductor layer with different material compositions. The emission wavelength of such a component may vary accordingly in one or two directions.

As embodied in connection with the previous exemplary embodiments, a greater wavelength range may be covered by a single chip due to the different emission wavelength in the regions of the first semiconductor layer with the different material compositions than is possible with known semiconductor light sources, so that, for example, a larger color space can be covered in connection with the broad spectrum of a light-emitting diode and a better color rendering can be achieved thereby. Due to the fact that the different emission wavelengths are emitted by the same chip, a more homogeneous color impression may be achieved than if several different single chips are used. The size can be minimized at the same time in this way.

Figure 5G:
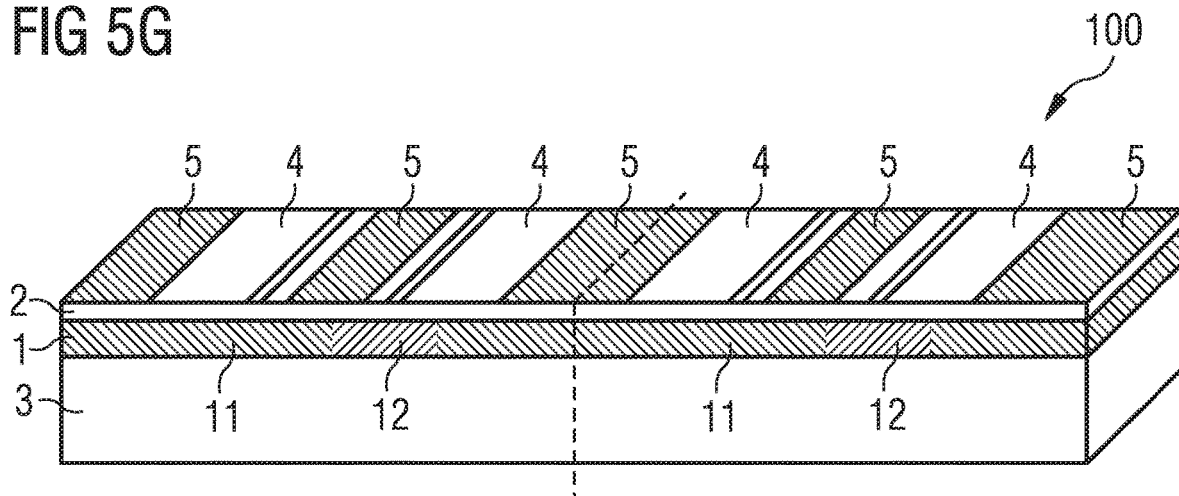

In FIGS. 5G to 5B, different exemplary embodiments of light-emitting semiconductor chips 100 are shown, which may be used as laser projection light sources, for example. The light-emitting semiconductor chip 100 of the exemplary embodiment of FIG. 5G has laser strips with first regions 11, which are configured to emit blue light, as well as laser strips with second regions 12, which are configured for the emission of green light. Due to the monolithic integration of such blue and green emitting laser emitting unit, a compact green-blue projection light source is possible with the advantage of a simplified assembly and lens adjustment.

Figure 5H:
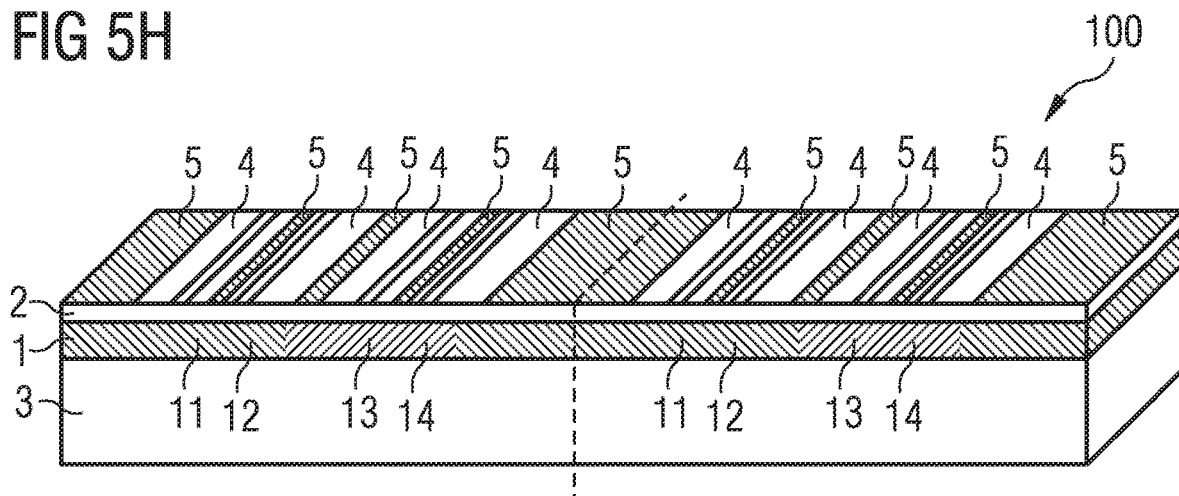

The light-emitting semiconductor chip 100 of the exemplary embodiment of FIG. 5H likewise has blue emitting and green emitting laser strips, wherein the regions 11 and 12 are configured, for example, to radiate blue light with a small wavelength difference, and the regions 13 and 14 are configured to radiate green light with a small wavelength difference, so that as described above in connection with FIGS. 3A and 3B a speckle reduction can be achieved in addition.

Figure 5I:
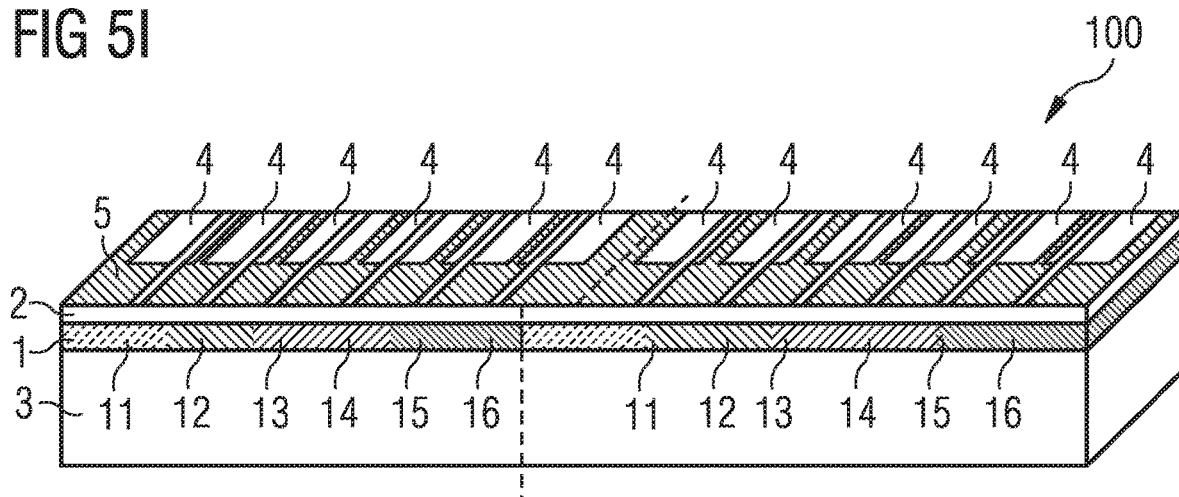

In FIG. 5I a light-emitting semiconductor chip 100 is shown that has a first semiconductor layer 1 with regions 11, 12, 13, 14, 15, 16, which are configured to produce light of different wavelengths, so that a broad color space may be realized for projection applications in a simultaneously compact, monolithically integrated construction.

In connection with FIGS. 5J to 5N, further exemplary embodiments of light-emitting semiconductor chips 100 embodied as multicolored light sources are shown, which may be used, for example, with regard to multicolored light sources. The construction of the light-emitting semiconductor chips 100 corresponds to that of the previous exemplary embodiments, so that marking of the individual elements has been dispensed with for the sake of clarity. The light-emitting semiconductor chip 100 in FIG. 5J can be configured, for example, due to three monolithically integrated regions of the first semiconductor layer with a different material composition to radiate red light at 700 nm, green light at 525 nm and blue light at 450 nm, which corresponds to an Adobe Wide Gamut RGB color space. The light-emitting semiconductor chips 100 of FIGS. 5K and 5L can be configured by four monolithically integrated regions of the first semiconductor layer with a different material composition to radiate cyan-colored or yellow light in addition for a respectively expanded color space, as indicated by the CIE chromaticity diagrams illustrated next to them. Compared with the semiconductor chip 100 in FIG. 5J, the light-emitting semiconductor chip 100 in FIG. 5M has in addition to a blue and a green emitting region, two regions of the first semiconductor layer that are configured to produce green light. Since in some wavelength ranges, such as in a green wavelength range, for example, the efficiency of laser diodes in particular may diminish, it may be advantageous to provide several laser strips according to the exemplary embodiment shown that may radiate light in a green wavelength range. By contrast, the exemplary embodiment of FIG. 5N shows a red-green-blue combination with a light-emitting semiconductor chip 100 with monolithically integrated laser strips for the emission of blue and green light and an additional laser diode chip 101, which may radiate red light in operation. Alternatively, instead of the laser diode chip 101, another light-emitting semiconductor chip 100 according to one of the previous exemplary embodiments may be used, for example, for the emission of red light in several wavelengths.

Figure 6A:
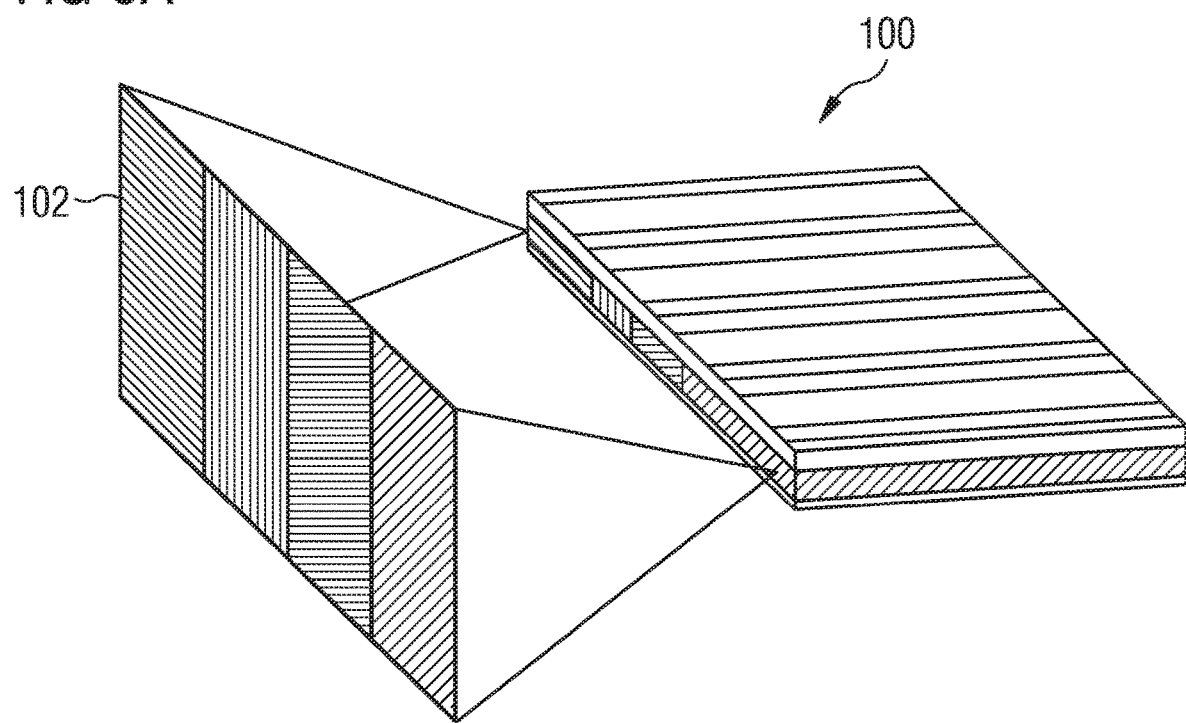
Figure 6B:
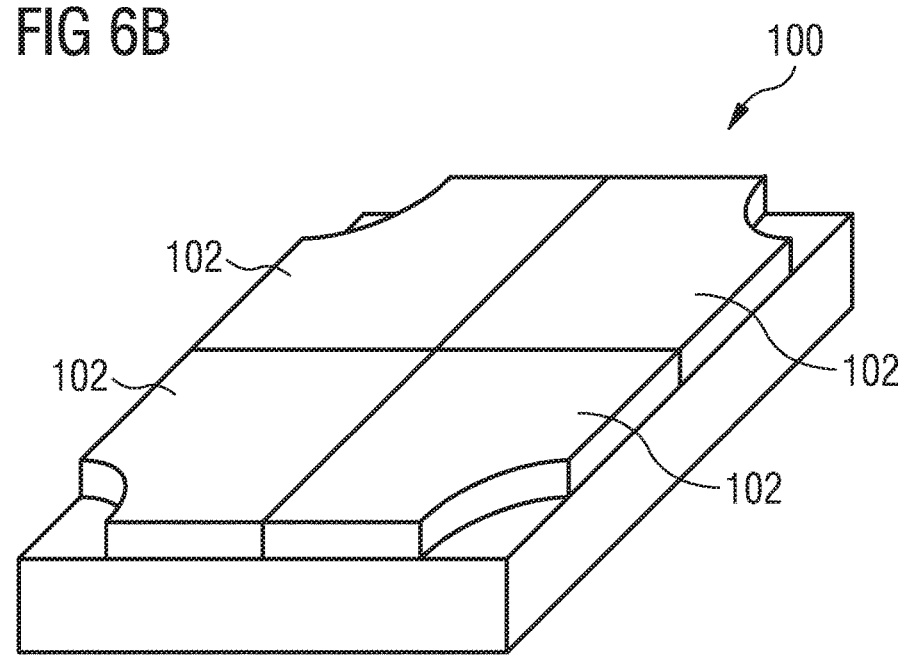

In FIGS. 6A and 6B, exemplary embodiments are shown of combinations of light-emitting semiconductor chips 100, embodied as a laser diode chip (FIG. 6A) or as a light-emitting diode chip (FIG. 6B) according to one of the previous exemplary embodiments, which also have wavelength conversion elements 102 with wavelength conversion substances. By such a combination of different blue, green or red emission spectra of the semiconductor chip 100 with wavelength conversion substances the color coordinates of the light source resulting therefrom can be varied in a targeted manner. The different colors can be controlled separately by separate control of the individual light-emitting regions of the light-emitting semiconductor chip 100. The wavelength conversion elements 102 can be integrated directly on the light-emitting semiconductor chip 100 or mounted separately from the light-emitting semiconductor chip 100, as indicated purely exemplarily in FIGS. 6A and 6B.

Possibilities for producing inhomogeneous lateral temperature distributions for growing the first semiconductor layer are described in conjunction with the following figures. The inhomogeneous lateral temperature distribution is selectively produced, during the growing of the first semiconductor layer, by local thermal influencing of predefined and specifically selected regions. In particular, the inhomogeneous lateral temperature distribution may be produced, at least partly, by a temperature distribution structure and/or by a locally varying light irradiation, as described in the following. If a temperature distribution structure is used, this can remain according to the arrangement in the semiconductor chip. Accordingly, the previously described semiconductor chips may additionally also have temperature distribution structures according to the following exemplary embodiments.

Represented in FIGS. 7A to 7D are exemplary embodiments for a substrate 6, on the surface 61 of which the first semiconductor layer can be grown. The substrate 6 is embodied as a growth substrate in the form of a wafer, having a diameter of, for example, greater or equal to 2 inches, and less than or equal to 12 inches. In particular, the wafer may have a diameter of 2 inches, or 4 inches, or 6 inches, or 8 inches, or 12 inches. Such a substrate 6 can be used to produce a multiplicity of semiconductor chips, by application of the semiconductor layer sequence and the further layers of the semiconductor chip on-wafer, and subsequent singulation. The substrate 6 may be used in a conventional coating process, in which one substrate or a plurality of such substrates is or are arranged on a suitable substrate carrier in a coating chamber.

Figure 7A:
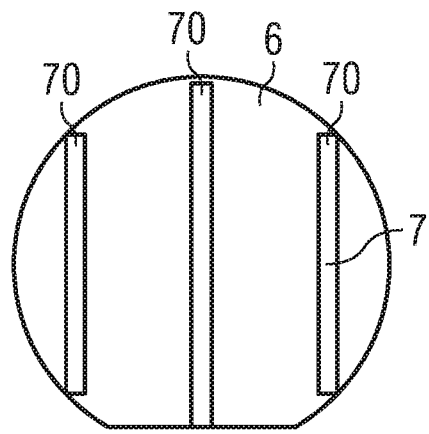
Figure 7B:
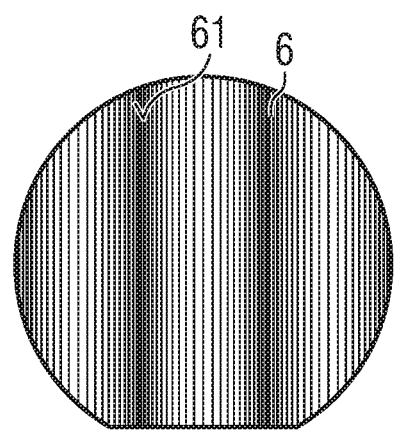
Figure 7C:
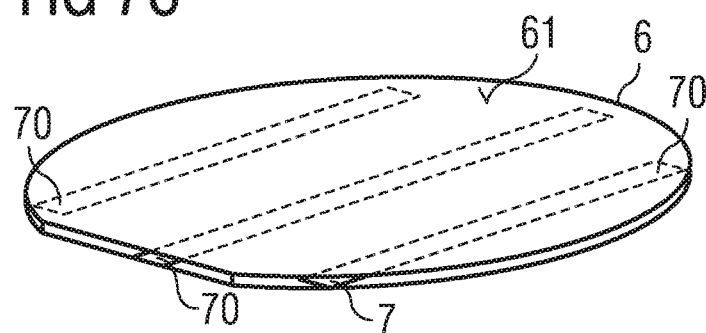

As can be seen, for example, in FIGS. 7A and 7C, the substrate 6 has a temperature distribution structure 7, which can selectively produce an inhomogeneous lateral temperature distribution along at least one direction of extent of the first semiconductor layer to be grown. The temperature distribution structure 7 has temperature distribution structure elements 70, which are suitable and provided for influencing the local temperature distribution on the surface 61 during the growth process. These may be heat conducting elements, heating elements and/or thermal barrier elements, as described at a later point in conjunction with FIGS. 8A to 8K. According to the desired temperature-changing effect of the temperature distribution structure 7, the latter may have, or be composed of, a dielectric material, a semiconducting material, a metal, or a plurality or combination of these materials. Dielectric materials can effect, for example, local influencing of the thermal conductivity and thereby, as a result of an improved or reduced conduction of heat, a local raising or lowering of the temperature on the surface 61, and consequently in the growing first semiconductor layer. Semiconducting and metallic materials can likewise influence the thermal conductivity and/or be selectively heated by irradiation by light or other suitable electromagnetic radiation such as, for example, microwave radiation, such that, in the region of the temperature distribution structure elements 70, more heat is produced, and consequently a higher temperature can be generated than in the adjacent regions. As described above, for example in the case of InAlGaN, the indium content of the first semiconductor layer, which is highly dependent on the growth temperature, can thereby be set and varied. Accordingly, properties of the first semiconductor layer such as, for example, the refractive index, the band gap and consequently, if appropriate, the emission wavelength and the absorption behavior, can be varied laterally.

In particular, the temperature distribution structure 7 has a plurality of temperature distribution structure elements 70, which are arranged regularly and/or periodically in the lateral direction, according to the intended inhomogeneous lateral temperature distribution profile. As shown, the temperature distribution structure elements may be embodied, for example, in the form of mutually separate islands and/or line structures.

In the exemplary embodiment shown, the temperature distribution structure elements 70 have, along the direction of their arrangement, i.e. in the exemplary embodiment shown, in the lateral direction perpendicular to the direction of main extent of the linear structures, a lateral extent that is less than a corresponding lateral extent of the semiconductor chips to be produced, such that the local temperature change of each of the temperature distribution structure elements 70 can be produced, respectively, in a sub-region of a future semiconductor chip. Temperature distribution structure elements 70 whose width along the direction of arrangement is less than corresponding dimensions of the semiconductor chips makes it possible to produce, for example, the regions of the first semiconductor layer that are described in conjunction with FIGS. 2A to 2H.

FIGS. 7A to 7D show, purely exemplarily, for reasons of clarity, only three strip-type temperature distribution structure elements 70, which are located on a rear side of the substrate 6 that faces away from the surface 61. The lateral inhomogeneous temperature distribution resulting therefrom, which, in the case of InAlGaN, also corresponds to the indium distribution on the substrate 6, is indicated in FIG. 7B. Depending on the size of the substrate 6 and the size of the semiconductor chips to be produced, which, for example in the case of laser diode chips, may have lateral dimensions of less than 100 µm up to some 100 µm for single-emitter chips, and up to one or more centimeters for laser bars and laser arrays, the number of semiconductor chips produced on-wafer, and consequently also the number and dimensions of the temperature distribution structure elements 70, may vary considerably.

Owing to the clearly visible temperature distribution structure elements 70, the chip production process can be very precisely adjusted to the regions having a differing material composition. The temperature distribution structure elements 70 may be produced, for example, in any shape and arrangement by lithographic methods, rendering possible a material composition that is customized to the subsequent semiconductor chips, and consequently a corresponding variation of desired properties on the substrate 6.

Figure 7D:
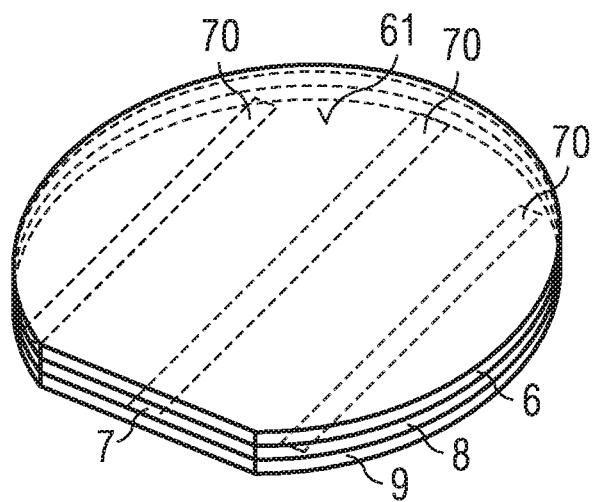

As previously described, the temperature distribution structure 7 may preferably be arranged on the rear side of the substrate 6, which is opposite the surface 61 provided for the growth process, such that the growth process can proceed on the surface 61 without disturbance by the temperature distribution structure 7. As shown in FIGS. 7A and 7C, the temperature distribution structure 7 may be arranged directly on the rear side of the substrate. As an alternative to this, it is possible for the temperature distribution structure 7 to be covered by at least one protective layer, for example made of a dielectric material, or, as shown in FIG. 7D, to be embedded between two such protective layers 8, 9, in order to prevent the growth process from being affected by outgassing and/or vaporization of material from the temperature distribution structure 7. In the exemplary embodiment of FIG. 7D, a first protective layer 8 is arranged between the temperature distribution structure 7 and the substrate 6, while a second protective layer 9 covers the temperature distribution structure 7. The protective layers 8, 9 may have the same or differing materials.

Further features and exemplary embodiments relating to the temperature distribution structure 7 are described in FIGS. 8A to 8K, in which, in this case, respectively only a portion of the substrate 6 and semiconductor material 10 grown thereon, and consequently also of the temperature distribution structure 7 and of the temperature distribution structure elements 70, is shown.

In particular, the temperature distribution structure 7 may have a plurality and/or a combination of the temperature distribution structure elements 70 described in the following. The temperature distribution structure elements 70 may have, in particular, a width in the lateral direction, which corresponds to a horizontal direction in the plane of the drawing, that is less than a width of the semiconductor chip to be produced above it. Furthermore, it is also possible for there to be a plurality of temperature distribution structure elements 70 in the region of a semiconductor chip, in order to produce a greater number of regions of differing material composition in the first semiconductor layer. The semiconductor material 10 may have, for example, one or more semiconductor layers grown on the substrate 6.

FIG. 8A shows a temperature distribution structure 7, having a temperature distribution structure element 70 that is arranged directly on the rear side of the substrate 6 that faces away from the surface 61. In particular, in the exemplary embodiment shown, the temperature distribution structure element 70 may have a different material than the substrate 6, and be embodied as a heating element that can be heated by being irradiated with suitable electromagnetic radiation, such that the substrate 6, and consequently also the semiconductor material 10 grown thereon, in the region over the temperature distribution structure element 70, can be heated to a higher temperature than in the adjacent regions that are not arranged over the temperature distribution structure element 70. For example, the temperature distribution structure element 70 shown may have a semiconducting material such as, for instance, silicon, which can be heated, for example, by irradiation of light having a wavelength that is in the absorption spectrum of the semiconducting material. As an alternative to this, the temperature distribution structure element 70 may also have, for example, a metal that can be heated by irradiation of suitable electromagnetic radiation such as, for example, microwave radiation.

During the growing of the semiconductor layer sequence, the substrate 6 may be supported, with the temperature distribution structure 7, on a substrate carrier, such that a conduction of heat between the substrate carrier and the substrate 6 can also simultaneously be influenced by the temperature distribution structure 7.

The substrate 6 may have, for example, a typical thickness in the range of from 100 μm to some 100 μm, for example 300 μm, such that the spread of heat in the lateral direction in the substrate 6 can be kept small in extent, and a desired temperature profile can be produced on the surface 61. Since the temperature distribution structure 7 is arranged on the rear side of the substrate 6, there is little chemical influence by the temperature distribution structure 7 during the growing of the semiconductor material 10. Depending on whether the substrate 6 remains, is thinned or removed entirely following the growing of the semiconductor material 10, the temperature distribution structure 7 can also remain in or be removed from the subsequently completed semiconductor chip. In particular, for example in the case of light-emitting diode chips, it is possible for the temperature distribution structure 7 to remain in the chip.

FIG. 8B shows an exemplary embodiment in which, in comparison with the previous exemplary embodiment, the temperature distribution structure 7 is arranged directly on the surface 61 of the substrate 6 that is provided for the process of growing the semiconductor material 10. The temperature distribution structure 7, which may be embodied, for example, as in the previous initial embodiment, is overgrown in the growing process by the semiconductor material 10, for example by means of a so-called ELOG process (ELOG: epitaxial lateral overgrowth). For this purpose, the temperature distribution structure 7 preferably has a thickness, in the direction of growth, of greater than or equal to 10 nm and less than or equal to 500 nm, or less than or equal to 300 nm, or less than or equal to 200 nm, or particularly preferably, less than or equal to 100 nm. As a result of the temperature distribution structure 7 being arranged on the surface 61 provided for growth, and consequently on the side of the substrate 6 that faces toward the semiconductor material 10, a spreading of heat in the substrate 6 can be avoided, thereby enabling a sharper temperature profile to be achieved. If, following the growing of the semiconductor layer sequence, the substrate 6 is not removed, or is only thinned, the temperature distribution structure 7 can remain in the subsequently completed semiconductor chip.

In order to protect the semiconductor material 10 against possible chemical impairment by the temperature distribution structure 7 and nevertheless avoid temperature spreading in the substrate 6, a protective layer 8 of a preferably dielectric material, for example an oxide, nitride or oxynitride, described above in the general part, which, together with the substrate 6, encapsulates the temperature distribution structure element 70, may be applied over the temperature distribution structure 7, as shown in FIG. 8C.

For example, the protective layer 8 may be applied by means of an application method such as, for instance, atomic layer deposition, that allows the formation of a layer that is as hermetically sealed as possible with, at the same time, a least possible layer thickness. The protective layer 8 in this case preferably does not extend over the entire surface 61 of the substrate 6, but insofar as possible covers only the elements of the temperature distribution structure 7.

Shown in FIG. 8D is a further exemplary embodiment, in which the temperature distribution structure 7, which is arranged on the rear side of the substrate 6 and which may be embodied as in FIG. 8A, is likewise covered by a protective layer 8, as described in conjunction with FIG. 8C. The protective layer 8 in this case may cover the entire rear side of the substrate 6 or also, as an alternative to the exemplary embodiment shown, only the temperature distribution structure element 70. Apart from avoidance of chemical influencing of the growth process, a suitable protective layer 8 may also be used, for example, to avoid a possible undesired attachment or adhesion to the substrate carrier.

As shown in FIG. 8E, the temperature distribution structure element 70 may also be surrounded on all sides by a protective layer 8, and thus embedded in the latter. In this case, the temperature distribution structure 7 is not directly arranged on the substrate 6. Instead of the design shown, of an embedded protective layer 8, as an alternative to this it is also possible, as described above in conjunction with FIG. 7D, for two protective layers to be used, between which the temperature distribution structure element 70 is arranged.

As shown in conjunction with FIGS. 8F and 8G, the temperature distribution structure 7 may also be embedded in the semiconductor material 10 or in the substrate 6. For this purpose, particularly preferably, a semiconductor material having a small band gap may be used to produce corresponding temperature distribution structure elements 70 embodied as heating elements. As an alternative to this, the temperature distribution structure 7 may also have a thermal conductivity that differs from that of the surrounding substrate material 6 or semiconductor material 10, such that the temperature distribution structure element 70 may be embodied as a heat conducting element or thermal barrier element integrated into the substrate 6 or into the semiconductor material 10. The temperature distribution structures 7 shown in FIGS. 8F and 8G may be produced, for example, by implantation. Furthermore, it is also possible for the substrate 6, or the semiconductor material 10 together with the substrate 6, to form a quasi-substrate having over-grown temperature distribution structures 7 and a subsequently planarized surface.

Shown in conjunction with FIGS. 8H to 8K are temperature distribution structures 7 having temperature distribution structure elements 70, which have, or are composed of, one or more elevations and/or recesses. For example, a surface structure having elevations and recesses that form the temperature distribution structure elements 70 may be formed in the rear side of the substrate 6 that faces away from the surface 61. Since the substrate 6 sits only with the elevations on a substrate carrier, the temperature coupling there is better, and consequently the temperature is locally higher in the regions over the elevations than in the regions over the adjacently arranged recesses. A differing thermal coupling of the substrate 6 to the substrate carrier is thus made possible. In this case, the temperature distribution structure elements 70 embodied as elevations may have the same material as the substrate 6 and, particularly preferably, be formed in one piece with the substrate 6.

As shown in FIG. 8I, the elevations and recesses formed by the temperature distribution structure 7 may also be composed of a material that is different from the substrate 6.

Shown in FIG. 8J is a temperature distribution structure 7 that is a combination of the temperature distribution structures 7 described in conjunction with FIGS. 8A and 8H. On the one hand, a temperature distribution structure element 70 that is embodied as a heating element is arranged on the rear side of the substrate. Additionally provided, in the rear side of the substrate, are temperature distribution structure elements 70 embodied as depressions, which form separating grooves that act as thermal barriers, whereby thermal spread in the substrate 6 can be reduced and a sharper temperature profile can thus be created.

As shown in FIG. 8K, a material having a lesser thermal conductivity than the substrate 6 may additionally be arranged in the recesses on the rear side of the substrate, in order to increase the thermal barrier function of the thus formed temperature distribution structure elements 70.

Figure 9A:
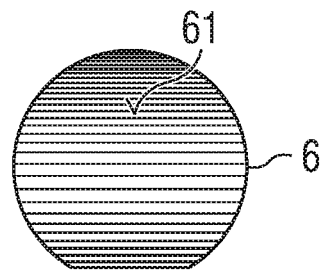
Figure 9B:
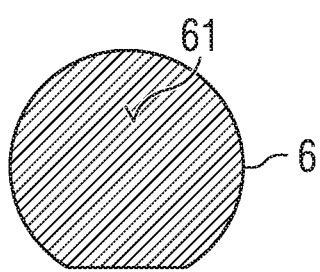
Figure 9C:
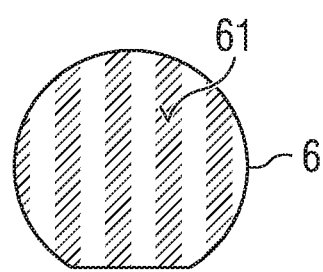

Indicated schematically in FIG. 9A is a typical temperature profile on the surface 61 of a wafer that can be used as a substrate 6 for the method describe here, in a conventional substrate carrier. It can be seen that the temperature distribution is not homogeneous over the substrate surface 61, but varies on a length scale and in lateral directions that depend on the arrangement of the semiconductor chips to be produced on-wafer. A corresponding temperature distribution may also be present, for example, in the growing of the first semiconductor layer. As previously described, this temperature profile affects the material composition of the semiconductor layers of the semiconductor chips, such that the semiconductor chips produced on-wafer may have mutually differing properties. In order to avoid this, the temperature profile on the surface 61 provided for the growth process may be homogenized in an additional method step, as shown in FIG. 9B and, on the basis thereof, as shown in FIG. 9C, set according to the desired inhomogeneous lateral temperature distribution.

As shown in the exemplary embodiments according to the following FIGS. 10A to 10F, in usual coating installations usually a plurality of substrates 6 are arranged on a substrate carrier 200, to enable these substrates to be coated simultaneously. In order to achieve a coating that is as homogeneous as possible, the substrate carrier 200 rotates, as shown by the arrow indicating the rotation direction 201. By means of the substrate carrier 200, the substrates 6 are heated to the desired growth temperature, and there may be inhomogeneous temperature distributions, such as that shown exemplarily in FIG. 9A, present on the surfaces 61. In order to homogenize the respective temperature profile on the surface 61 of the substrate 6, which profile may be different for each substrate 6, this can first be measured, for example by means of an infrared detector.

Figure 10A:
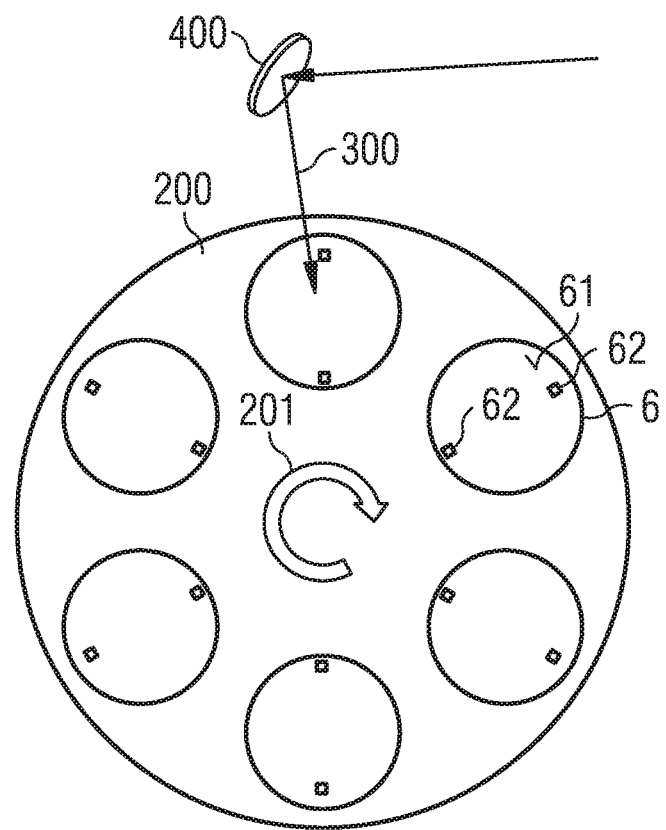
Figure 10B:
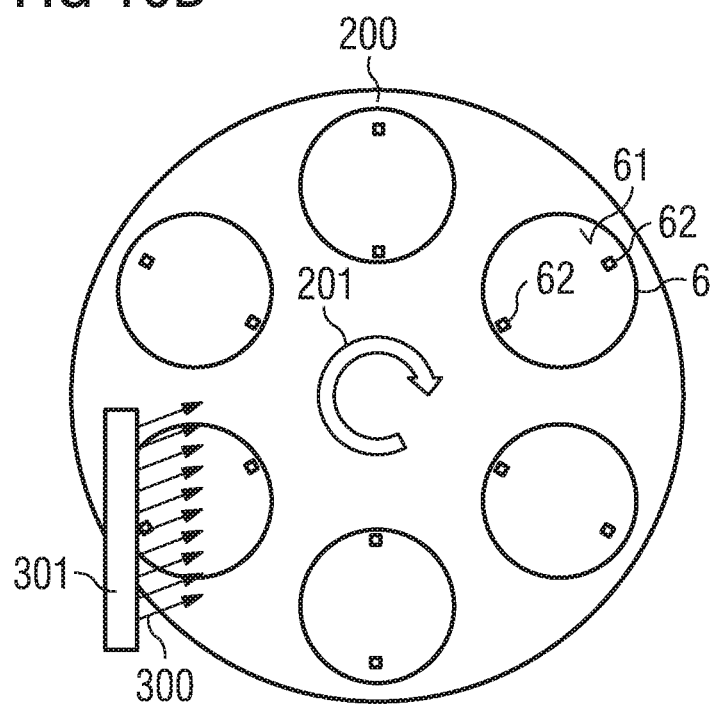
Figure 10C:
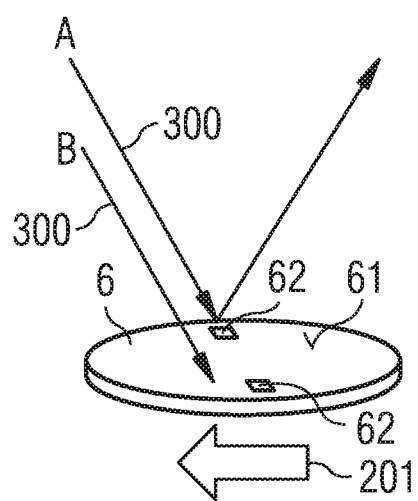

Furthermore, each of the substrates 6 is selectively heated in sub-regions, in order to create, on the respective surface 61 thereof, a temperature profile that is as homogeneous as possible. Such heating may be effected, for example, as shown in FIG. 10A, by means of a locally varying light radiation, i.e. by means of irradiation of a suitably variable light beam 300, which can be absorbed, for example, in the substrate material or a semiconductor material applied to the substrates 6. The light beam may be, for example, a single beam or multiple beam of one or more light sources, and be selectively deflected onto selected sub-regions of the surfaces 61 of the substrates 6 by means of a suitable light deflecting means 400, for instance by means of a mirror or another suitable device. As an alternative to this, as shown in FIG. 10B, it is also possible to use, for example, a plurality of light sources 301, for example a plurality of laser sources in a laser array, which preferably can irradiate light independently of one another onto the surface 61 of a substrate 6. Preferably, the entire surface 61 of the substrates 6 can thereby be covered in each case, the light irradiation being effected with the rotary motion of the substrate carrier 200 and the determined individual temperature profiles of the substrates 6 being taken into account.

The inhomogeneous lateral temperature distribution desired for growing the first semiconductor layer may be created by means of a previously described temperature distribution structure that is additionally present. As an alternative to this, it is also possible for this to be produced, likewise, by means of the described light irradiation, the heating profile to be effected by the light irradiation being adapted accordingly, in comparison with a pure homogenization of the temperature profile. Moreover, it is also possible for the light heating formed by a locally varying light irradiation to be used, without an additional homogenization step, only to create a desired inhomogeneous temperature profile.

As previously described, the locally varying light irradiation during the growing of the first semiconductor layer may comprise irradiation by means of a laser, which radiates onto the growing first semiconductor layer, in predefined and specifically selected regions, one or more light beams 300, which, as a result of absorption in the growing first semiconductor layer or in a layer underneath, such as, for example, an already grown layer and/or the substrate 6, results in a local and inhomogeneous heating in these regions, such that differing effective growth temperatures prevail in differing regions for the growing first semiconductor layer. The locally varying light irradiation may be realized, in particular, such that one or more regions, whose surface extents are less than those of the semiconductor chips, can be irradiated simultaneously or successively on the substrate 6. The light irradiation in this case may also be effected in a pulsed manner. Scanning of the surface on which the first semiconductor layer is grown is made possible by the described light deflecting means 400 and/or by the use of a plurality of light sources 301.

Figure 10D:
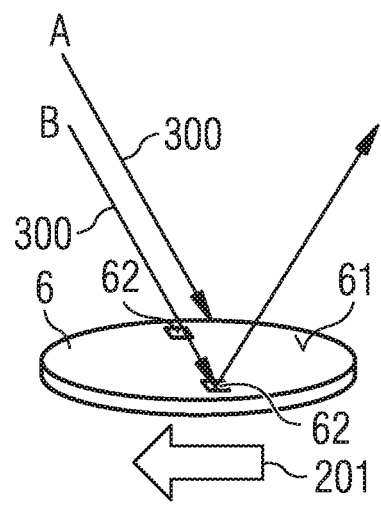
Figure 10E:
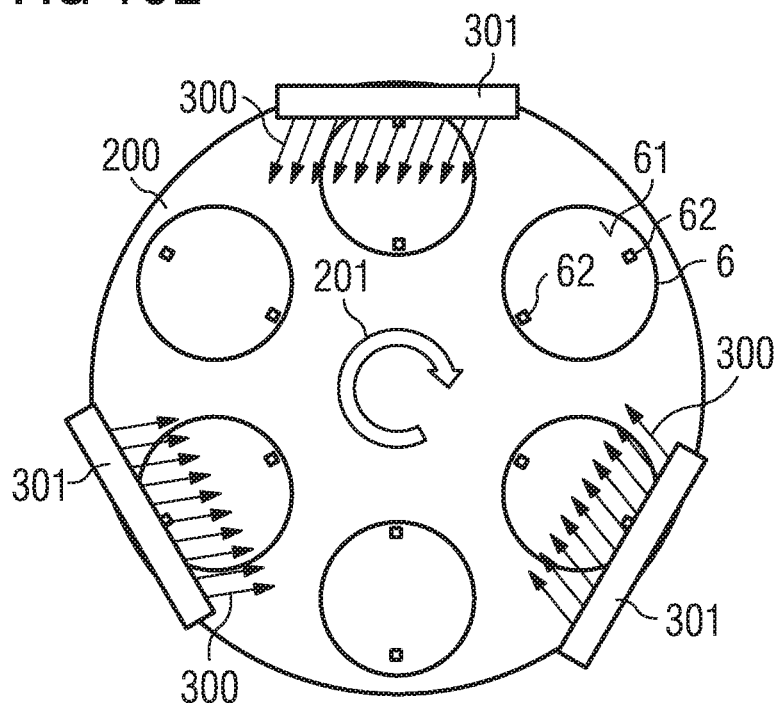

As shown in FIGS. 10A to 10F, the substrates 6 or, alternatively, also the substrate carrier 200 may be formed with at least two markings 62, which serve as reflectors, or adjustment marks, to enable the light beam 300 to be synchronized. As shown exemplarily in FIGS. 10C and 10D, at an instant T1, for example, the light beam 300 denoted by A may strike a marking 62 and be reflected by the latter (FIG. 10C) while, at the same or a later instant T2, the light beam 300 denoted by B strikes a marking 62 and is reflected by the latter (FIG. 10D). The reflected signals from the markings 62 can be used, on the one hand, to enable an exact synchronization of the light beam 300 onto the substrate 6. In addition, it is possible to calculate a rotation of the substrate 6 in the substrate carrier 200 on the basis of the possibly time-delayed signals from the at least two markings 62, and thus to adjust the required temperature profile to correspond to the markings 62. The markings 62 may be used both in a homogenization of the temperature profile and subsequently in the chip process, for adjusting the chip structures to correspond to the temperature profile.

It is also possible to use a plurality of light sources, in the form of a plurality of individual light sources or, as shown in FIG. 10B, in the form of several pluralities of light sources 301, for the purpose of simultaneously heating a plurality of substrates 6. It is thereby possible to achieve a more uniform temperature distribution during the rotation of the substrate carrier 200. Moreover, more power can be applied locally, since a plurality of light sources can illuminate one same region on a substrate 6, such that greater temperature gradients are possible. Furthermore, the local resolution can also be improved by an offset arrangement, for example of a plurality of laser arrays constituted by a plurality of light sources 301.

Figure 10F:
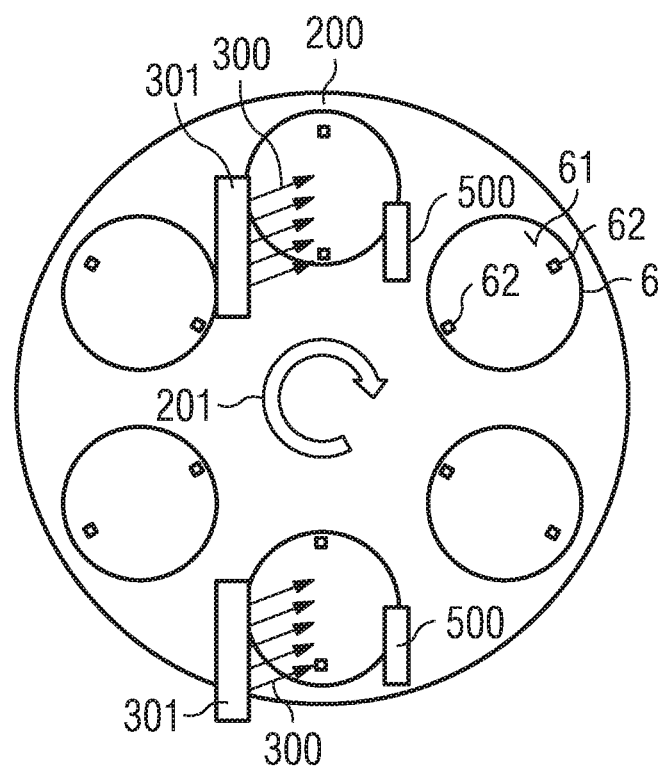

As shown in FIG. 10F, the pluralities of light sources 301 may also illuminate only sub-regions of the substrates 6. This makes it possible, for example, to simplify the assignment of reflected signals from the markings 62. Furthermore, detectors 500 may be arranged on the substrate carrier 200 or in the proximity thereof, to enable direct detection of the signals reflected by the markings 62.

The exemplary embodiments and the features thereof that are described in conjunction with the figures may be combined with one another, according to further exemplary embodiments, even if such combinations are not explicitly described. Furthermore, the exemplary embodiments described in conjunction with the figures may have alternative and additional features, according to the description in the general part.

The description on the basis of the exemplary embodiments does not limit the invention to these exemplary embodiments. Rather, the invention comprises each new feature and each combination of features, this including, in particular, each combination of features in the claims, even if this feature, or this combination itself, is not explicitly stated in the claims or exemplary embodiments.

LIST OF REFERENCES 1 first semiconductor layer
2 second semiconductor layer
3 third layer
4 contact layer
5 passivation layer
6 substrate
7 temperature distribution structure
8, 9 protective layer
10 semiconductor material
11, 12, 13, 14, 15, 16 region
21 ridge waveguide structure
61 surface
62 marking
70 temperature distribution structure element
100 semiconductor chip
101 laser diode chip
102 wavelength conversion element
200 carrier
201 rotation direction
300 light beam
301 plurality of light sources
400 light deflecting means
500 detector
1000, 2000, 3000 method step

The invention claimed is:

1. A method for producing a light-emitting semiconductor chip, having a first semiconductor layer on a growth substrate, wherein the first semiconductor layer is at least part of an active layer provided for generating light and has a lateral variation of a material composition along at least one direction of extent, the method comprising,
growing the first semiconductor layer on the growth substrate on which an inhomogeneous lateral temperature distribution is created along the at least one direction of extent, such that the lateral variation of the material composition of the first semiconductor layer is produced,
wherein the inhomogeneous lateral temperature distribution is selectively created, at least partly, on the growth substrate, by a locally varying light irradiation, and wherein the locally varying light irradiation is controlled based on an output of at least one of a temperature measuring instrument or a measuring instrument for a wafer curvature measurement,
wherein a light power irradiated onto the growth substrate is locally adapted based on at least one of instantaneous curvature data based on the wafer curvature measurement, or a spatially resolved temperature measurement by the temperature measuring instrument, such that a temperature profile is homogenized during the growth process, and
wherein a modulation is selectively applied to the homogenized temperature profile, such that the lateral inhomogeneous temperature distribution is created on the growth substrate.

2. The method according to claim 1, wherein the inhomogeneous lateral temperature distribution is selectively created, at least partly, on the growth substrate, by a temperature distribution structure, wherein the temperature distribution structure has at least one temperature distribution structure element and effects a local increase or reduction of a temperature of the growing first semiconductor layer.

3. The method according to claim 1, wherein the first semiconductor layer is grown in a wafer composite.

4. The method according to claim 1, wherein the growth substrate comprises markings in a form of adjustment or trigger markings.

5. The method according to claim 4, wherein the markings are detected during the growth process, in the course of the locally varying light irradiation, and the temperature profile is adjusted based on the markings.

6. The method according to claim 1, wherein the locally varying light irradiation comprises irradiation with a laser.

7. A method for producing a light-emitting semiconductor chip, having a first semiconductor layer on a growth substrate, wherein the first semiconductor layer is at least part of an active layer provided for generating light and has a lateral variation of a material composition along at least one direction of extent, the method comprising,
growing the first semiconductor layer on the growth substrate on which an inhomogeneous lateral temperature distribution is created along the at least one direction of extent, such that the lateral variation of the material composition of the first semiconductor layer is produced,
wherein the inhomogeneous lateral temperature distribution is selectively created, at least partly, on the growth substrate, by a locally varying light irradiation, and wherein the locally varying light irradiation is controlled based on an output of a measuring instrument for a wafer curvature measurement.

8. A method for producing a light-emitting semiconductor chip, having a first semiconductor layer on a growth substrate, wherein the first semiconductor layer is at least part of an active layer provided for generating light and has a lateral variation of a material composition along at least one direction of extent, the method comprising,
growing the first semiconductor layer on the growth substrate on which an inhomogeneous lateral temperature distribution is created along the at least one direction of extent, such that the lateral variation of the material composition of the first semiconductor layer is produced,
wherein the inhomogeneous lateral temperature distribution is selectively created, at least partly, on the growth substrate, by a locally varying light irradiation, and wherein the locally varying light irradiation is controlled based on an output of at least one of a temperature measuring instrument or a measuring instrument for a wafer curvature measurement,
wherein a light power irradiated onto the growth substrate is locally adapted based on at least one of instantaneous curvature data based on the wafer curvature measurement, or a spatially resolved temperature measurement by the temperature measuring instrument, such that a temperature profile is homogenized during the growth process,
wherein the growth substrate comprises markings in a form of adjustment or trigger markings, and
wherein the markings are detected during the growth process, in the course of the locally varying light irradiation, and the temperature profile is adjusted based on the markings.

* * * * *